(12) United States Patent
Lee et al.

(10) Patent No.: US 11,538,858 B2
(45) Date of Patent: Dec. 27, 2022

(54) MEMORY DEVICE, METHOD OF FORMING THE SAME, AND MEMORY ARRAY

(71) Applicant: Taiwan Semiconductor Manufacturing Company, Ltd., Hsinchu (TW)

(72) Inventors: Chien-Min Lee, Hsinchu County (TW); Ming-Yuan Song, Hsinchu (TW); Yen-Lin Huang, Hsinchu (TW); Shy-Jay Lin, Hsinchu County (TW); Tung-Ying Lee, Hsinchu (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 3 days.

(21) Appl. No.: 17/362,979

(22) Filed: Jun. 29, 2021

(65) Prior Publication Data
US 2022/0285435 A1    Sep. 8, 2022

Related U.S. Application Data

(60) Provisional application No. 63/156,956, filed on Mar. 5, 2021.

(51) Int. Cl.
| | |
|---|---|
| *G11C 11/16* | (2006.01) |
| *H01L 27/22* | (2006.01) |
| *H01L 43/04* | (2006.01) |
| *H01L 43/06* | (2006.01) |
| *G11C 11/18* | (2006.01) |
| *H01L 43/14* | (2006.01) |

(52) U.S. Cl.
CPC .......... *H01L 27/228* (2013.01); *G11C 11/161* (2013.01); *G11C 11/1673* (2013.01); *G11C 11/1675* (2013.01); *G11C 11/18* (2013.01); *H01L 43/04* (2013.01); *H01L 43/06* (2013.01); *H01L 43/14* (2013.01)

(58) Field of Classification Search
CPC ....... H01L 27/228; H01L 43/04; H01L 43/06; H01L 43/14; G11C 11/161; G11C 11/1673; G11C 11/1675; G11C 11/18
USPC .................................................. 365/158, 173
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |

(Continued)

*Primary Examiner* — Michael T Tran
(74) *Attorney, Agent, or Firm* — JCIPRNET

(57) ABSTRACT

Provided are a memory device and a method of forming the same. The memory device includes: a selector; a magnetic tunnel junction (MTJ) structure, disposed on the selector; a spin orbit torque (SOT) layer, disposed between the selector and the MTJ structure, wherein the SOT layer has a sidewall aligned with a sidewall of the selector; a transistor, wherein the transistor has a drain electrically coupled to the MTJ structure; a word line, electrically coupled to a gate of the transistor; a bit line, electrically coupled to the SOT layer; a first source line, electrically coupled to a source of the transistor; and a second source line, electrically coupled to the selector, wherein the transistor is configured to control a write signal flowing between the bit line and the second source line, and control a read signal flowing between the bit line and the first source line.

20 Claims, 21 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2019/0334080 A1* | 10/2019 | Ahmed .................. H01L 43/08 |
| 2020/0006627 A1* | 1/2020 | Manipatruni ......... H01L 27/228 |
| 2020/0066968 A1* | 2/2020 | Park ....................... H01L 43/12 |
| 2020/0135804 A1* | 4/2020 | Luo .................... G11C 11/1675 |
| 2020/0136018 A1* | 4/2020 | Ying .................. G11C 11/1675 |
| 2020/0168261 A1* | 5/2020 | Jaiswal ................ H01L 27/222 |
| 2020/0235288 A1* | 7/2020 | Ikegawa ................ H01L 43/14 |
| 2021/0134339 A1* | 5/2021 | Song .................... H01L 27/228 |
| 2021/0193912 A1* | 6/2021 | Gupta ................. G11C 11/5607 |
| 2021/0202827 A1* | 7/2021 | Song .................... H01L 27/224 |
| 2021/0210127 A1* | 7/2021 | Drouard ............. G11C 11/1655 |
| 2021/0233577 A1* | 7/2021 | Saito ....................... H01L 29/82 |
| 2021/0367143 A1* | 11/2021 | Lee ......................... H01L 43/02 |
| 2022/0148635 A1* | 5/2022 | Yogendra ................ G11C 11/18 |

* cited by examiner

|  | Read | Write 1 | Write 0 |
|---|---|---|---|
| BLm | 0.1V (<0.5Vth) | 1.5V (Vth) | 0V |
| BLm+1 | Floating | 0.75V (0.5Vth) | 0.75V (0.5Vth) |
| WLn | ON | Floating | Floating |
| WLn+1 | Floating | Floating | Floating |
| SLn | 0V | 0V | 1.5V (Vth) |
| SLn+1 | Floating | 0.75V (0.5Vth) | 0.75V (0.5Vth) |

FIG. 5B

MEMORY DEVICE, METHOD OF FORMING THE SAME, AND MEMORY ARRAY

CROSS-REFERENCE TO RELATED APPLICATION

This application claims the priority benefit of U.S. provisional application Ser. No. 63/156,956, filed on Mar. 5, 2021. The entirety of the above-mentioned patent application is hereby incorporated by reference herein and made a part of this specification.

BACKGROUND

Many modern day electronic devices contain electronic memory. Electronic memory may be volatile memory or non-volatile memory. Non-volatile memory is able to store data in the absence of power, whereas volatile memory is not. Some examples of next generation electronic memory include resistive random-access memory (RRAM), phase-change random-access memory (PCRAM), magnetoresistive random-access memory (MRAM), or the like. The MRAM offers comparable performance to volatile static random-access memory (SRAM) and comparable density with lower power consumption to volatile dynamic random-access memory (DRAM). In addition, a process of the MRAM can be integrated with the existing complementary metal-oxide-semiconductor (CMOS) process. In this case, the MRAM can be regarded as a promising candidate for next generation embedded memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5B is an operation table of a memory array illustrated in FIG. 5A.

DETAILED DESCRIPTION

Figure 1A:
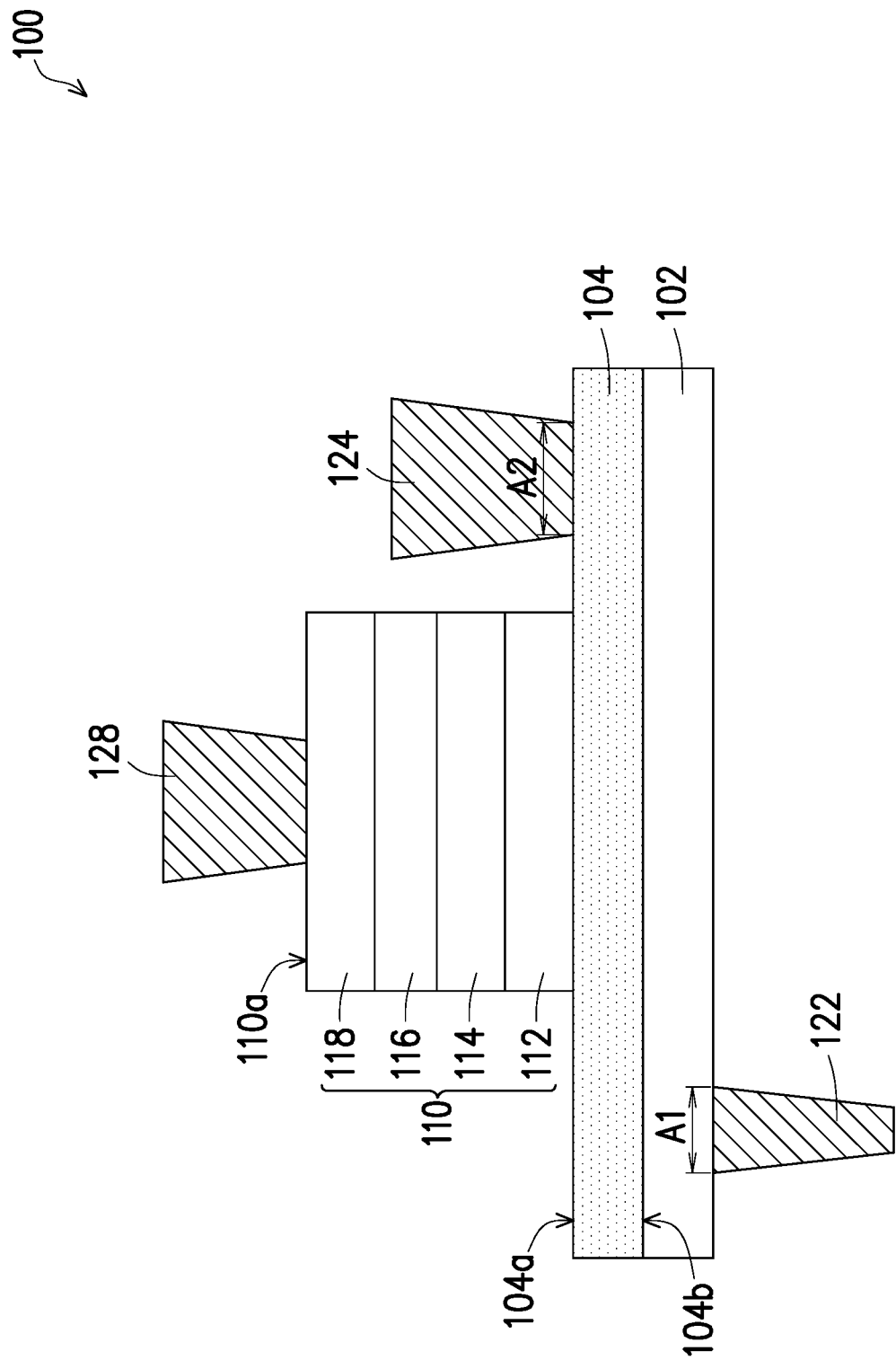
FIG. 1A is a cross-sectional view of a memory cell in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) includes first and second ferromagnetic films separated by a thin non-magnetic barrier layer, typically a quantum mechanical tunnel barrier layer (referred to as a "tunnel barrier layer"). One of the ferromagnetic films (often referred to as a "reference layer") has a fixed magnetization direction, while the other ferromagnetic film (often referred to as a "free layer") has a variable magnetization direction, most stably pointing in one of two opposite directions. If the magnetization directions of the reference layer and free layer are in a parallel (P) orientation, electrons will relatively more easily tunnel through the tunnel barrier layer, meaning that the MTJ is in a low-resistance state. Conversely, if the magnetization directions of the reference layer and free layer are in an antiparallel (AP) orientation, electrons will have more difficulty tunneling through the tunnel barrier layer, meaning that the MTJ is in a high-resistance state. The MTJ can be switched between two states of electrical resistance by reversing the magnetization direction of the free layer.

One common mechanism by which the state of the free layer can be switched includes spin-transfer torque (STT), in which electrons tunnel through the tunnel barrier layer, as in so called "STT-MRAM." In a STT-MRAM device the read current and write current are both applied across the MTJ. This can result in a number of challenges, including a reduction of endurance and/or an increase of power consumption of the STT-MRAM device due to write currents traveling through the MTJ. Another mechanism that can be utilized to switch the state of the free layer includes spin orbit torque (SOT), in which an in-plane current is applied across an adjacent SOT layer, as in so called "SOT-MRAM." This in turn facilitates switching the state of the free layer without applying a current across the MTJ, thereby increasing endurance and decreasing power consumption of the SOT-MRAM device.

The SOT-MRAM device is usually configured as a two-transistor one-resistor (2T1R) configuration. In such embodiment, a first transistor is electrically coupled to one end of the SOT layer responsible for the write operation, a second transistor is electrically coupled to the MTJ side opposite to the SOT layer for read operation. However, the two transistors occupy most of the area of the SOT-MRAM device, which is not conducive to the current trend of increasingly miniaturized semiconductor memory devices. In accordance with some embodiments, a memory device including a one-selector one-transistor one-resistor (1S1T1R) configuration is provided to replace the conventional 2T1R configuration, so as to reduce the cell size of the memory device, thereby improving the performance of the memory device and increasing the commercial competitiveness. In addition, a cross-point operating method can be used to operate a memory array including the 1S1T1R configuration, so as to simplify the memory array programming.

FIG. 1A is a cross-sectional view of a memory cell in accordance with a first embodiment.

Referring to FIG. 1A, a memory cell 100 include a selector 102, a spin orbit torque (SOT) layer 104, and a magnetic tunnel junction (MTJ) structure 110. Specifically, the MTJ structure 110 may be disposed on the selector 102, and the SOT layer 104 may be disposed between the selector 102 and the MTJ structure 110. In such embodiment, the memory cell 100 is referred to as a one-selector one-resistor (1S1R) configuration.

In some embodiments, the selector 102 may be an ovonic threshold switch (OTS), and/or may have a thickness within a range of about 5 nm to 30 nm, such as 15 nm. The OTS may be a two-terminal symmetrical voltage sensitive switching device and may be characterized before it is used in a circuit device. The OTS mechanism includes in a switch between a high resistive (OFF state) at a low electric field and a low resistive state (ON state) when a specific voltage is obtained. For example, when an applied voltage that is less than a threshold voltage is applied one the selector 102, the selector 102 remains in an "off" state, e.g., an electrically nonconductive state. Alternatively, responsive to an applied voltage across the selector 102 that is greater than the threshold voltage, the selector 102 enters an "on" state, e.g., an electrically conductive state. That is, the selector 102 is referred to as a switch for determining to turn on or turn off the memory cell 100. As such, the OTS may allow for bidirectional switching and may be easily integrated as a select device for a memory cell 100. It should be noted that the selector 102 may replace the write transistor to reduce the cell size of the memory cell 100, thereby increasing the number of the memory devices per unit area. Further, the selector 102 may provide higher driving current than the write transistor based on the same footprint, thereby improving the performance of the memory cell 100.

In some embodiments, the SOT layer 104 may, for example, be or include heavy metals such as platinum, palladium, tungsten, tantalum, gold, an alloy of the foregoing, such as an alloy of palladium and platinum (e.g., $Pd_{0.25}Pt_{0.75}$), an alloy of gold and platinum (e.g., $Au_{0.25}Pt_{0.75}$), or topological insulators such as $Bi_2Se_3$, $WTe_2$, or the like and/or may have a thickness within a range of about 5 nm to 15 nm, such as 10 nm. In some embodiments, the SOT layer 104 also be referred to as a spin-hall electrode (SHE), which is configured such that when a write current passes along the SOT layer 104 it may generate spin accumulations via the spin Hall effect near the top of the SOT layer 104 for switching the magnetic moment of the free layer 112 of the MTJ structure 110, thereby driving a change of the resistance value of the MTJ structure 110. In such embodiments, the generated spin accumulation may set the resistance value of the MTJ structure 110 by providing torques to the free layer magnetization.

In some embodiments, the MTJ structure 110 includes a free layer 112, a barrier layer 114, a pinned reference layer 116, and an anti-ferromagnetic (AFM) layer 118. The free layer 112 may be disposed on and in contact with the SOT layer 104. The pinned reference layer 116 may be disposed over the free layer 112. The barrier layer 114 may be disposed between the free layer 112 and the pinned reference layer 116. The AFM layer 118 may be disposed on the pinned reference layer 116, so that the pinned reference layer 116 is disposed between the barrier layer 114 and the AFM layer 118.

In some embodiments, the free layer 112 may, for example, be or comprise iron, cobalt, nickel, an alloy of the foregoing, cobalt iron boron, or the like and/or have a thickness within a range of about 0.5 nm to 3.0 nm, such as 2.0 nm. In some embodiments, the thickness of the free layer 112 may depend on whether a perpendicular or an in-plane preferred direction for the stable magnetic states is desired. In some embodiments, the tunnel barrier layer 114 may, for example, be or comprise magnesium oxide (MgO), aluminum oxide (e.g., $Al_2O_3$), nickel oxide, or the like and/or have a thickness within a range of about 0.5 nm to 1.5 nm, such as 1.0 nm. In some embodiments, the pinned reference layer 116 may, for example, be a synthetic anti-ferromagnetic (SAF) structure composed of two ferromagnetic layers separated by one RKKY (Ruderman-Kittel-Kasuya-Yosida) coupling spacer. The ferromagnetic layer comprises iron, cobalt, nickel, an alloy of the foregoing, cobalt iron boron, iron boron, or the like and/or have a thickness within a range of about 1.0 nm to 3.0 nm, such as 2.0 nm. The RKKY spacer typically comprises ruthenium, iridium, or the like and/or have a thickness within a range of about 0.3 nm to 1.0 nm, such as 0.8 nm. In some embodiments, the AFM layer 118 may, for example, be or include platinum manganese (PtMn), iridium manganese (IrMn), rhodium manganese (RhMn) and iron manganese (FeMn), a combination thereof, or the like and/or have a thickness within a range of about 10 nm to 30 nm, such as 20 nm.

The memory cell 100 is configured to store a data state based upon a resistive value of the MTJ structure 110. For example, the MTJ structure 110 will either store a first data state (e.g., a logical "0") if the MTJ structure 110 has a low resistance state or a second data state (e.g., a logical "1") if the MTJ structure 110 has a high resistance state. In some embodiments, during operation, the MTJ structure 110 can be changed between the low resistance state and the high resistance state through the injection of polarized spin electrons from the SOT layer 104. In such embodiment, a memory device having the memory cell 100 is referred to as a SOT-MRAM device.

In detail, the pinned reference layer 116 may have a fixed or a "pinned" magnetic orientation that points in a first direction. The free layer 112 may have a variable or "free" magnetic orientation, which can be switched between two or more distinct magnetic polarities that each represents a different data state, such as a different binary state. In some embodiments, if the magnetization directions of the pinned reference layer 116 and the free layer 112 are in a parallel relative orientation, it is more likely that charge carriers (e.g., electrons) will tunnel through the tunnel barrier layer 114, such that the MTJ structure 110 is in a low-resistance state. Conversely, in some embodiments, if the magnetization directions of the pinned reference layer 116 and the free layer 112 are in an anti-parallel orientation, it is less likely that charge carriers (e.g., electrons) will tunnel through the tunnel barrier layer 114, such that the MTJ structure 110 is in a high-resistance state. Under normal operating conditions, the MTJ structure 110 may switch between the low-resistance state and the high-resistance state based upon a write signal (e.g., a current and/or a voltage) applied (laterally) across the SOT layer 104. In some embodiments, the AFM layer 118 may be included to pin the magnetization direction of the reference layer 116 when the MTJ structure 110 is an in-plane MTJ structure. In some alternative embodiments, the AFM layer 118 may be omitted when the MTJ structure 110 is a perpendicular MTJ structure.

As shown in FIG. 1A, the memory cell 100 further includes a first electrical terminal 122, a second electrical terminal 124, and a third electrical terminal 128. In some embodiment, the first electrical terminal 122 and the second electrical terminal 124 are disposed on opposite sides of the SOT layer 104, and the third electrical terminal 128 is disposed on the same side of the SOT layer 104 with the second electrical terminal 124. For example, the second electrical terminal 124 is disposed on a top surface 104a of the SOT layer 104. The first electrical terminal 122 is disposed on a bottom surface 104b of the SOT layer 104 opposite to the top surface 104a and in contact with the selector 102. The third electrical terminal 128 is disposed on and in contact with a top surface 110a of the MTJ structure 110. The second electrical terminal 124 is laterally offset from the third electrical terminal 128 by a non-zero distance. In the embodiment, a contact area A1 between the first electrical terminal 122 and the selector 102 is less than a contact area A2 between the second electrical terminal 124 and the SOT layer 104 for a lower leakage current. However, the embodiments of the present disclosure are not limited thereto, in other embodiments, the contact area A1 may be the same as or greater than the contact area A2 when the diameter of the first electrical terminal 122 is within a range of about 40 nm to 80 nm.

In some embodiments, during write operation of the memory cell 100, a write signal (e.g., a current and/or a voltage) is applied between the first electrical terminal 122 and the second electrical terminal 124, such that the write signal travels across the SOT layer 104. That is, the write signal may travel from the first electrical terminal 122 to the second electrical terminal 124, or vice versa (i.e., the path of the write signal is bidirectional). An electrical pulse along the path of the write signal affects the magnetization direction of the free layer 112 disposed within the MTJ structure 110 of the memory cell 100. In addition, a read signal (e.g., a current and/or a voltage) is applied between the second electrical terminal 124 and the third electrical terminal 128, such that the read signal travels through the SOT layer 104 and the MTJ structure 110. That is, the read signal may travel from the second electrical terminal 124 to the third electrical terminal 128.

Figure 1B:
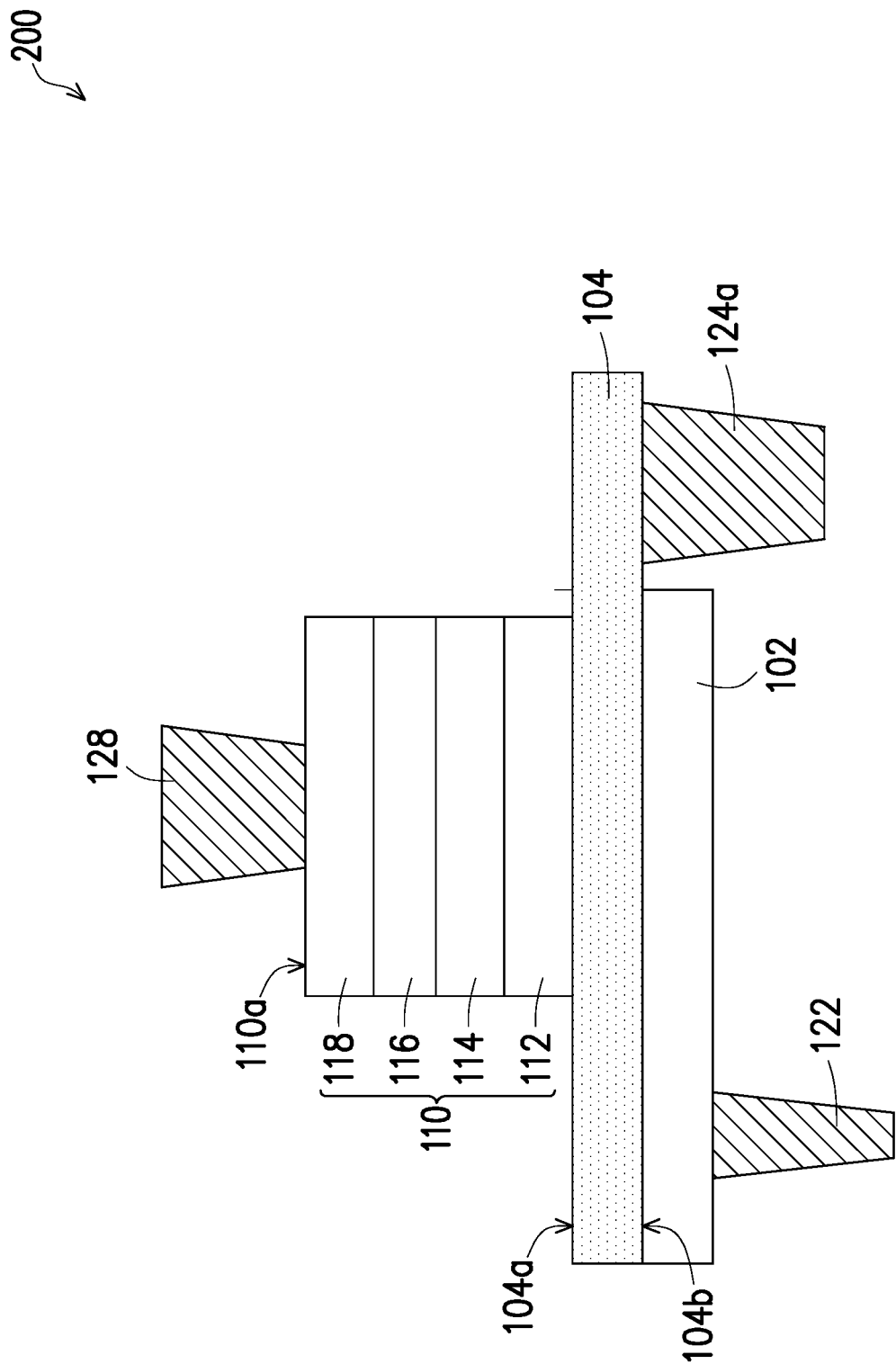
FIG. 1B is a cross-sectional view of a memory cell in accordance with a second embodiment.

FIG. 1B is a cross-sectional view of a memory cell in accordance with a second embodiment.

Referring to FIG. 1B, a memory cell 200 of the second embodiment is similar to the memory cell 100 of the first embodiment. That is, the structures, materials, and functions of the memory cell 200 are similar to those of the memory cell 100, and thus the details are omitted herein. The main difference between the memory cell 200 and the memory cell 100 lies in that the memory cell 200 has a second electrical terminal 124a disposed on the same side of the SOT layer 104 with the first electrical terminal 122. That is, the second electrical terminal 124a and the first electrical terminal 122 are both disposed on the bottom surface 104b of the SOT layer 104 and laterally offset from each other by a non-zero distance. The first electrical terminal 122 may be in contact with the selector 102, and the second electrical terminal 124a may be in contact with the bottom surface 104b of the SOT layer 104.

Figure 2:
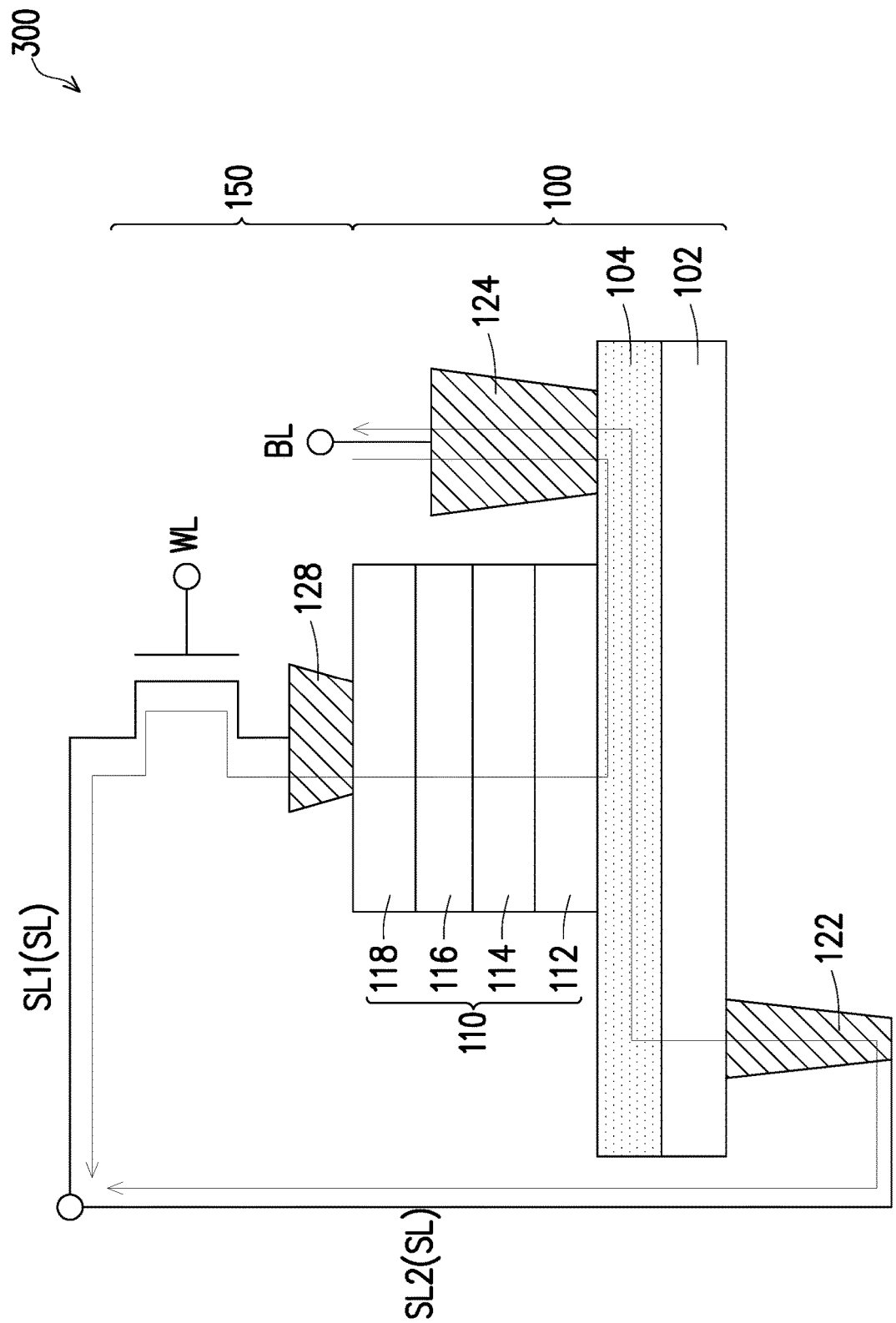
FIG. 2 is a cross-sectional view of a unit cell in accordance with some embodiments.

FIG. 2 is a cross-sectional view of a unit cell in accordance with some embodiments.

Referring to FIG. 2, a unit cell 300 of the present embodiment is similar to the memory cell 100 of the first embodiment. That is, the structures, materials, and functions of the unit cell 300 are similar to those of the memory cell 100, and thus the details are omitted herein. The main difference between the unit cell 300 and the memory cell 100 lies in that the unit cell 300 further includes a transistor 150. In such embodiment, the unit cell 300 is referred to as a one-selector one-transistor one-resistor (1S1T1R) configuration.

In detail, the transistor 150 may have a gate, a source, and a drain. As shown in FIG. 2, the gate of the transistor 150 is electrically coupled to a word line WL. The source of the transistor 150 is electrically coupled to a first source line SL1. The drain of the transistor 150 is electrically coupled to the MTJ structure 110 through the third electrical terminal 128. In addition, a bit line BL is electrically coupled to the SOT layer 104 through the second electrical terminal 124. A second source line SL2 is electrically coupled to the selector 102 through the first electrical terminal 122. In the present embodiment, the first source line SL1 and the second source line SL2 are electrically connected to each other to form a common source line SL.

In some embodiments, during write operation of the unit cell 300, a write signal (e.g., a current and/or a voltage) is applied between the bit line BL and the common source line SL, such that the write signal travels across the SOT layer 104. That is, the write signal may travel from the bit line BL to the common source line SL, or vice versa (i.e., the path of the write signal is bidirectional). An electrical pulse along the path of the write signal affects the magnetization direction of the free layer 112 disposed within the MTJ structure 110 of the unit cell 300. On the other hand, during read operation of the unit cell 300, a read signal (e.g., a current and/or a voltage) is applied between the bit line BL and the common source line SL, such that the read signal travels through the SOT layer 104 and the MTJ structure 110. That is, when reading the data stored in the MTJ structure 110, the word line WL is asserted to turn on the transistor 150. According to the conducting state of the MTJ structure 110, it can be determined whether the current provided by the bit line BL can pass through the MTJ structure 110 and the transistor 150, and then flow to the common source line SL, thereby reading the data stored in the MTJ structure 110.

Figure 3A:
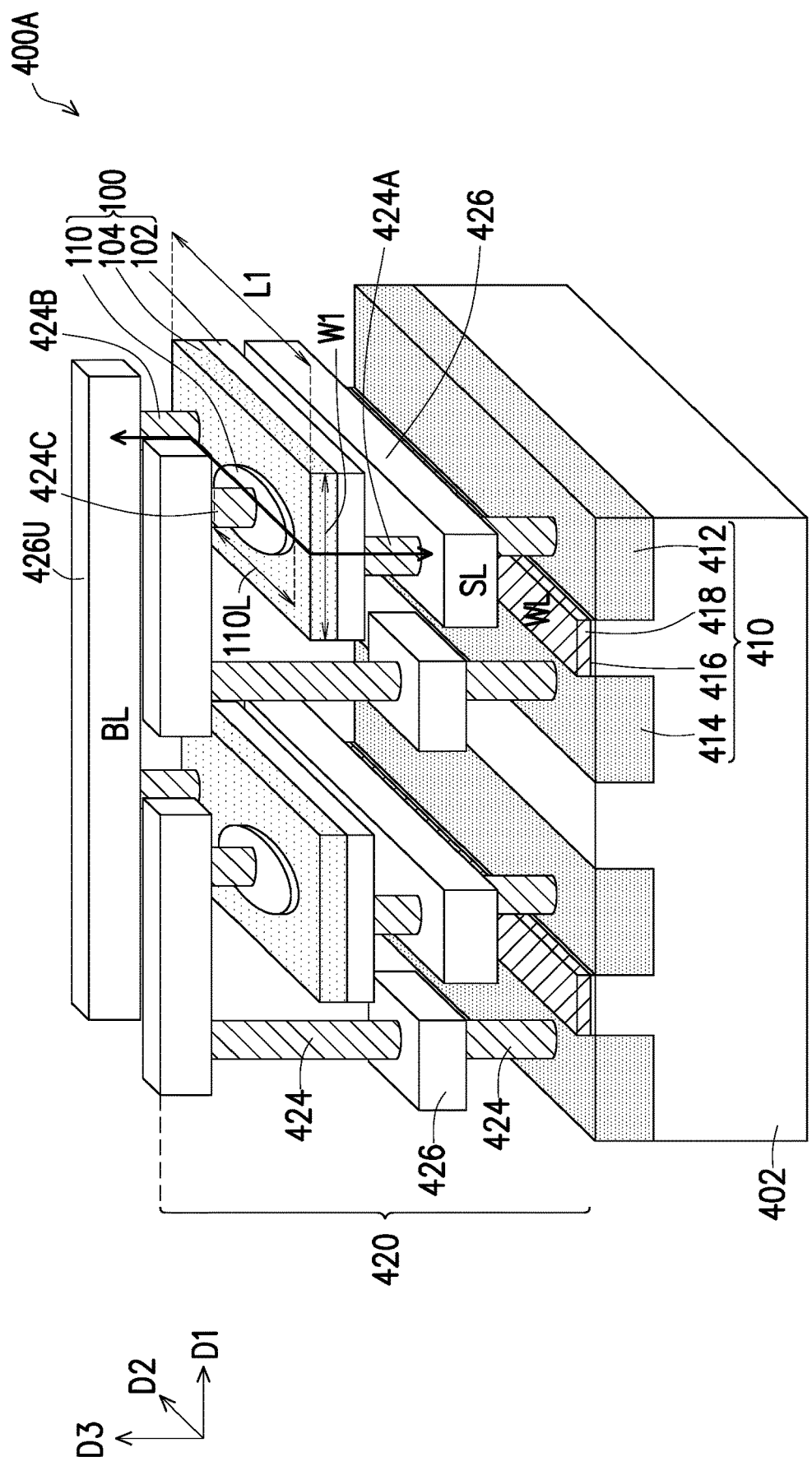
FIG. 3A is a perspective view of a memory device in accordance with a first embodiment.

FIG. 3A is a perspective view of a memory device in accordance with a first embodiment.

Referring to FIG. 3A, a memory device 400A includes a semiconductor substrate 402, a plurality of electrical components 410, an interconnect structure 420, and a plurality of memory cells 100. In some embodiments, the electrical components 410, such as transistors, resistors, capacitors, inductors, diodes, or the like, are formed in a device region of a semiconductor substrate 402 in the front-end-of-line (FEOL) processing of semiconductor manufacturing. For example, the transistor may include fin field effect transistors (FinFETs), nanostructure transistor, gate-all-around transistor (e.g. nanowire, nanosheet, or the like), planar transistor, etc. The transistor may be formed by gate-first processes or gate-last processes. Hereinafter, the electrical components 410 may be referred to as the transistors 410, and the transistors 410 shown in FIG. 3A are illustrated with the planar transistors as an example. The semiconductor substrate 402 may be a bulk substrate, such as a silicon substrate, doped or undoped, or an active layer of a semiconductor-on-insulator (SOI) substrate. The semiconductor substrate 402 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The transistors 410 may be formed in/on the semiconductor substrate 402 using any suitable formation method known or used in semiconductor manufacturing.

In some embodiments, the transistors 410 each include a source region 412, a drain region 414, a gate dielectric layer 416, and a gate electrode 418. As shown in FIG. 3A, the gate dielectric layer 416 and the gate electrode 418 may be disposed on the semiconductor substrate 402, and gate dielectric layer 416 may be disposed between the gate electrode 418 and the semiconductor substrate 402. The source region 412 and the drain region 414 may be disposed in the semiconductor substrate 402 at opposite sides of the gate electrode 418. In some embodiments, the gate electrode 408 may, for example, be or comprise doped polysilicon or a metal, such as aluminum, copper, a combination of the foregoing, or the like. In some embodiments, the gate dielectric layer 416 may, for example, be or comprise an oxide, such as silicon dioxide, a high-k dielectric material, or the like. In some embodiments, the semiconductor substrate 402 may comprise a first doping type (e.g., p-type) and the source/drain regions 412 and 414 may include a second doping type (e.g., n-type) opposite the first doping type.

As shown in FIG. 3A, the interconnect structure 420 may overlay the semiconductor substrate 402 and the transistors 410, where the memory cells 100 are embedded within the interconnect structure 420. In some embodiments, the interconnect structure 420 includes a dielectric structure (not shown), a plurality of conductive vias 424, and a plurality of conductive wires 426, where the plurality of conductive vias 424 and the plurality of conductive wires 426 are stacked in a direction D3 and may be formed in the back-end-of-line (BEOL) processing of semiconductor manufacturing. In some embodiments, the conductive vias and wires 424, 426 may, for example, each be or comprise aluminum, copper, tungsten, titanium, a combination of the foregoing, or the like. In further embodiments, the dielectric structure may comprise a plurality of dielectric layers, such as inter-level dielectric (ILD) layers (e.g., comprising an oxide, a low-k dielectric material, or the like) and/or etch stop layers (e.g., comprising silicon carbide, silicon nitride, or the like).

In some embodiments, one conductive wire in the plurality of conductive wires 426 is electrically coupled to a source line (SL). Further, the gate electrode 418 of the transistor 410 is electrically coupled to a word line (WL). An upper conductive wire 426U in the plurality of conductive wires 426 is electrically coupled to a bit line (BL). Hereinafter, the upper conductive wire 426U may be referred to as the bit line BL. The interconnect structure 420 is configured to electrically couple one or more of the transistors 410 to the memory cell 100 (e.g., by way of the conductive vias and wires 424, 426).

The memory cell 100 is disposed within the interconnect structure 420. In detail, a first conductive via 424A underlies the memory cell 100 and is contact with the selector 102. In such embodiment, the first conductive via 424A may be referred to as a bottom electrode via (BEVA) or the first electrical terminal 122 (FIG. 1A). A second conductive via 424B is disposed on and in contact with the SOT layer 104. In such embodiment, the second conductive via 424B may be referred to as the second electrical terminal 124 (FIG. 1A). A third conductive via 424C is disposed on and in contact with the MTJ structure 110. In such embodiment, the third conductive via 424C may be referred to as a top electrode via (TEVA) or the third electrical terminal 128 (FIG. 1A). In some embodiments, during write operation of the memory device 400A, a write signal (e.g., a current and/or a voltage) is applied between the first conductive via 424A and the second conductive via 424B, such that the write signal travels across the SOT layer 104. In some embodiments, a direction of the write signal may be determined by potentials of the bit line (BL) and the source line (SL) (i.e., the path of the write signal is bidirectional). An electrical pulse along the path of the write signal affects the magnetization direction of the free layer disposed within the MTJ structure 110 of the memory cell 100.

As shown in FIG. 3A, the bit line BL may extend along a first direction D1, and the word line WL (or the source line SL) may extend along a second direction D2 different from the first direction D1. In some embodiments, the first direction D1 is substantially perpendicular to the second direction D2. The SOT layer 104 may have a width W1 along the first direction D1 and a length L1 along the second direction D2, where the length L1 is greater than the width W1. In such embodiment, the length L1 is parallel to a long axis 110L of the MTJ structure 110, as shown in FIG. 3A. In some embodiments, the shape of the MTJ structure 110 is ellipse (as shown in FIG. 3A) when the MTJ structure 110 is an in-plane MTJ structure. However, the embodiments of the present disclosure are not limited thereto, in other embodiments, the shape of the MTJ structure 110 is circular (not shown) when the MTJ structure 110 is a perpendicular MTJ structure. The length L1 of the SOT layer 104 may depend on the process ability of the BEOL processing of semiconductor manufacturing. That is, when the pitch between the second conductive via 424B and the third conductive via 424C is decreased, the length L1 of the SOT layer 104 may be reduced, and even the length of the entire memory cell 100 also be reduced, thereby increasing the number of the memory devices per unit area.

In some embodiments, during write operation of the memory device 400A, a write signal (e.g., a current and/or a voltage) is applied between the first conductive via 424A and the second conductive via 424B, such that the write signal travels across the SOT layer 104. That is, the write path may travel along the second direction D2 which is the same as the extending direction of the word line WL or source line SL. In some embodiments, the bit line BL is across adjacent two memory cells 100 and electrically coupled to the adjacent two memory cells 100. In other words, the adjacent two memory cells 100 may share the same bit line BL.

It should be noted that the memory device 400A may have the memory cell 100 directly over the source region 412. In other words, the memory cell 100 may be completely or partially overlapped with the underlying source region 412. In such embodiment, the memory cell 100 may be defined within the range of the transistor 410, so as to reduce the cell size of the memory device 400A, thereby increasing the number of the memory devices per unit area. Compared with the conventional two-transistor one-resistor (2T1R) configuration, the footprint of the memory device 400A (i.e., 1S1T1R configuration) may have a potential to reduce by 34% to 50% or more.

While the transistors 410 of FIG. 3A are depicted as the planar transistor configuration, the present disclosure is not limited thereto. For example, in other embodiments, the transistors 410 may have the FinFET configuration, as shown in FIG. 3B.

Figure 3B:
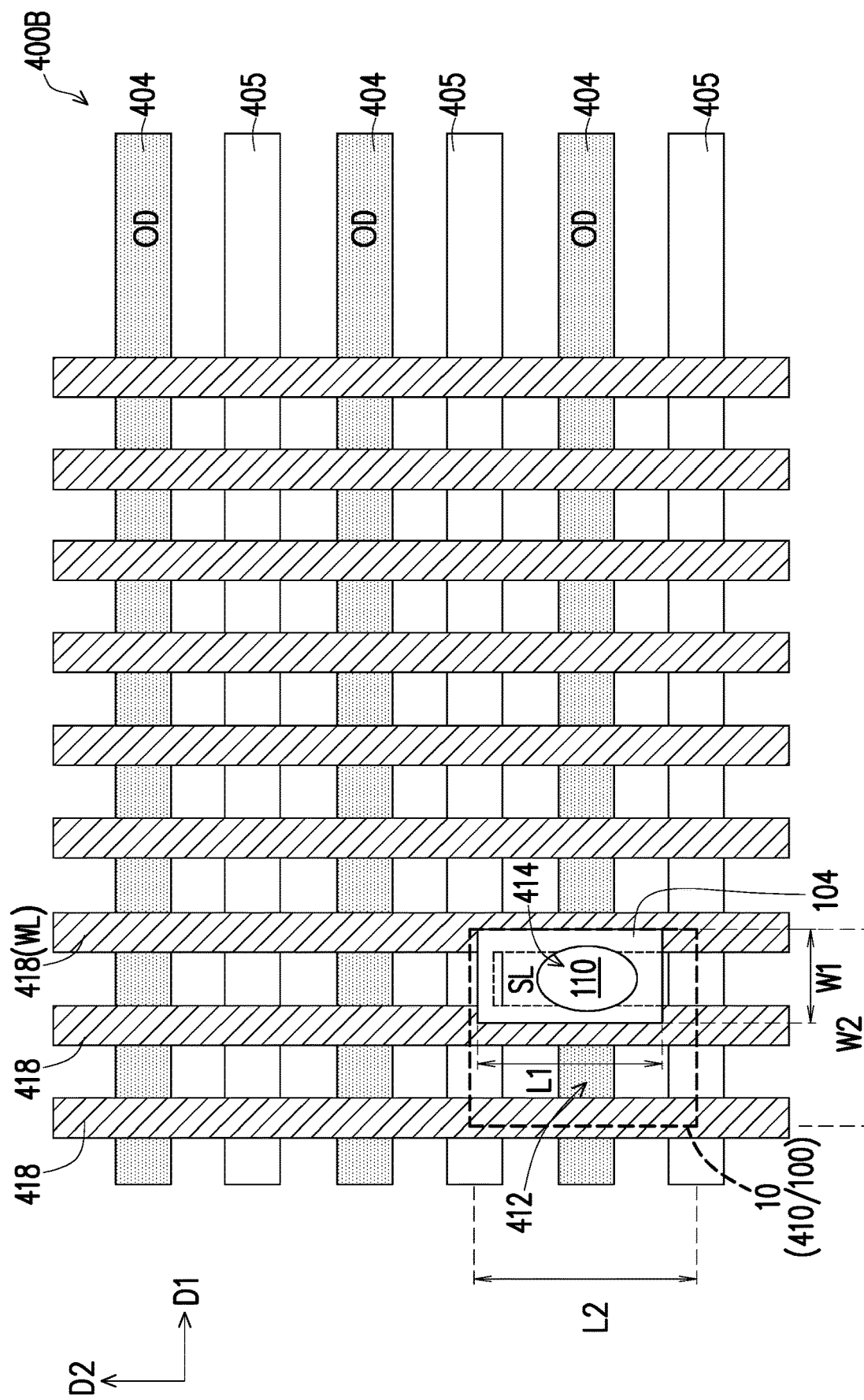
FIG. 3B is a top view of a memory device in accordance with another embodiment.

Referring to FIG. 3B, a memory device 400B may include a plurality of active areas 404, a plurality of isolation structures 405, and a plurality of gate electrodes 418. In some embodiments, the active areas 404 are formed in the semiconductor substrate 402, where the active areas 404 extend along the first direction D1 and are arranged alternately along the second direction D2. In some embodiments, the term "active area" discussed in the present disclosure is also referred to as "OD" (oxide diffusion area). In addition, the isolation structures 405 are formed between the active areas 404 to electrically isolate the adjacent active areas 404 from each other. In some embodiments, the isolation structures 405 may be an oxide (e.g., silicon oxide), a nitride (e.g., silicon nitride), the like, or a combination thereof, such as shallow trench isolation (STI) structures. Although the active areas 404 illustrated in FIG. 3B is separated from the adjacent isolation structures 405, the embodiments of the present disclosure are not limited thereto. In other embodiments, the active areas 404 are connected to the adjacent isolation structures 405. Further, the gate electrodes 418 may formed on the semiconductor substrate and across the active areas 404 and the isolation structures 405, where the gate electrodes 418 extend along the second direction D2 and are arranged alternately along the first direction D1.

In some embodiments, a unit cell 10 including the transistor 410 and the memory cell 100 is shown as a dashed box in FIG. 3B. The source line SL and the memory cell 100 (including the selector, the SOT layer 104, and the MTJ structure 110) are vertically stacked on the source region 414 of the transistors 410. The length L2 of the unit cell 10 may depend on the length L1 of the SOT layer 104. In such embodiment, the length L2 of the unit cell 10 is approximately within the range of the two adjacent active areas 404 (e.g., 2OD). On the other hand, the width W2 of the unit cell 10 may depend on the size of the transistor 410. In such embodiment, the width W2 of the unit cell 10 is approximately within the range of the two adjacent gate electrodes 418 (e.g., 2PO). In some embodiments, the term "gate" discussed in the present disclosure is also referred to as "PO." Although the MTJ structure 110 illustrated in the top view of FIG. 3B is an elliptical shape, the embodiments of the present disclosure are not limited thereto. In other embodiments, the shape of the MTJ structure 110 in the top view may be a circular shape, or another suitable shape.

Figure 3C:
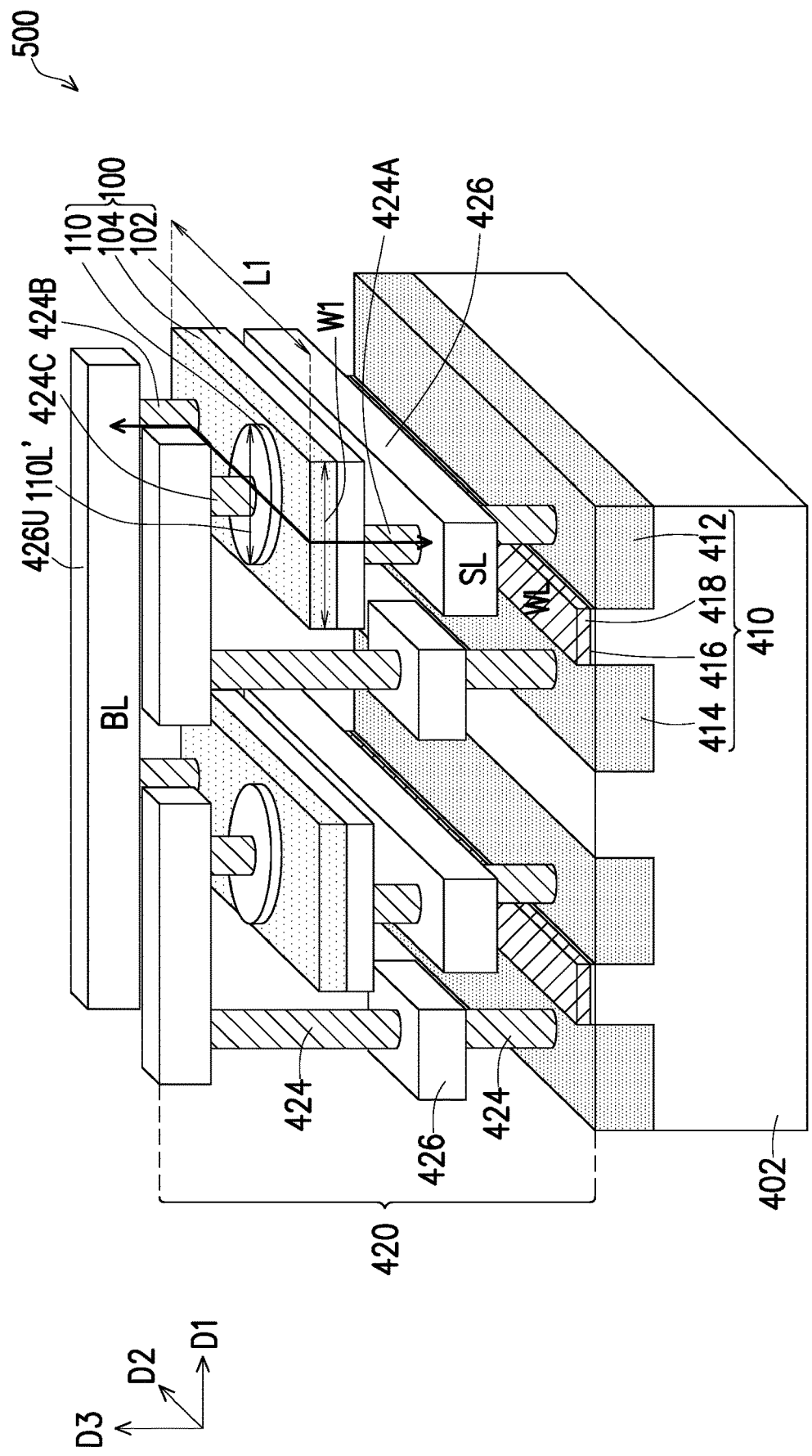
FIG. 3C is a perspective view of a memory device in accordance with a second embodiment.

FIG. 3C is a perspective view of a memory device in accordance with a second embodiment.

Referring to FIG. 3C, a memory device 500 of the second embodiment is similar to the memory device 400A of the first embodiment. That is, the structures, materials, and functions of the memory device 500 are similar to those of the memory device 400A, and thus the details are omitted herein. The main difference between the memory device 500 and the memory device 400A lies in that a long axis 110L' of the MTJ structure 110 of the memory device 500 is orthogonal to the length L1 of the SOT layer 104. In such embodiment, the long axis 110L' of the MTJ structure 110 of the memory device 500 may be orthogonal to the write path from the source line SL to the bit line BL.

Figure 4A:
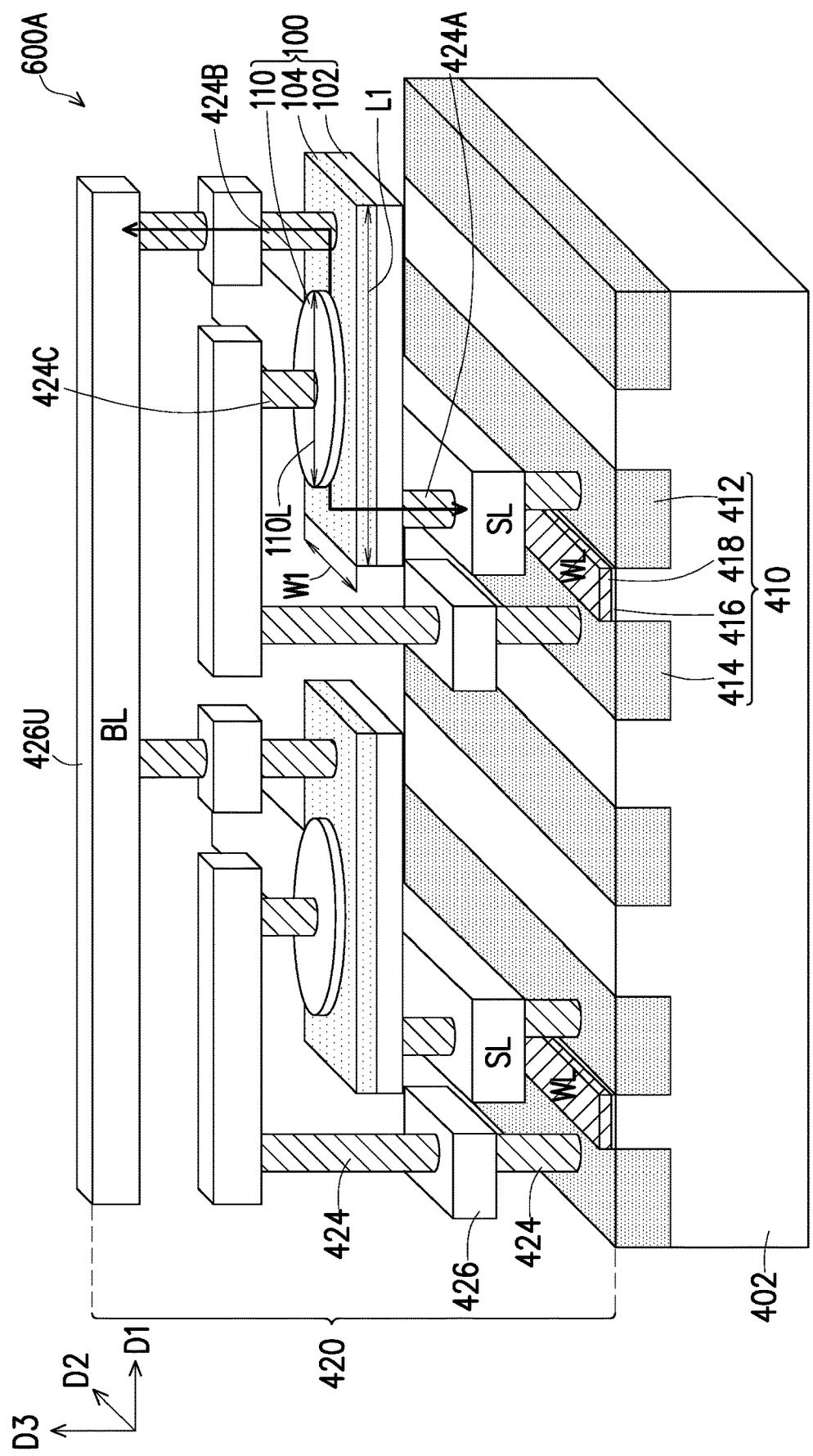
FIG. 4A is a perspective view of a memory device in accordance with a third embodiment.

FIG. 4A is a perspective view of a memory device in accordance with a third embodiment.

Referring to FIG. 4A, a memory device 600A of the third embodiment is similar to the memory device 400A of the first embodiment. That is, the structures, materials, and functions of the memory device 600A are similar to those of the memory device 400A, and thus the details are omitted herein. The main difference between the memory device 600A and the memory device 400A lies in that the memory device 600A has the selector 102 and the SOT layer 104 extending along the first direction D1. Specifically, the SOT layer 104 may have a length L1 along the first direction D1 and a width W1 along the second direction D2, where the length L1 is greater than the width W1. In such embodiment, the length L1 is parallel to a long axis 110L of the MTJ structure 110, as shown in FIG. 4A.

While the transistors 410 of FIG. 4A are depicted as the planar transistor configuration, the present disclosure is not limited thereto. For example, in other embodiments, the transistors 410 may have the FinFET configuration, as shown in FIG. 4B.

Figure 4B:
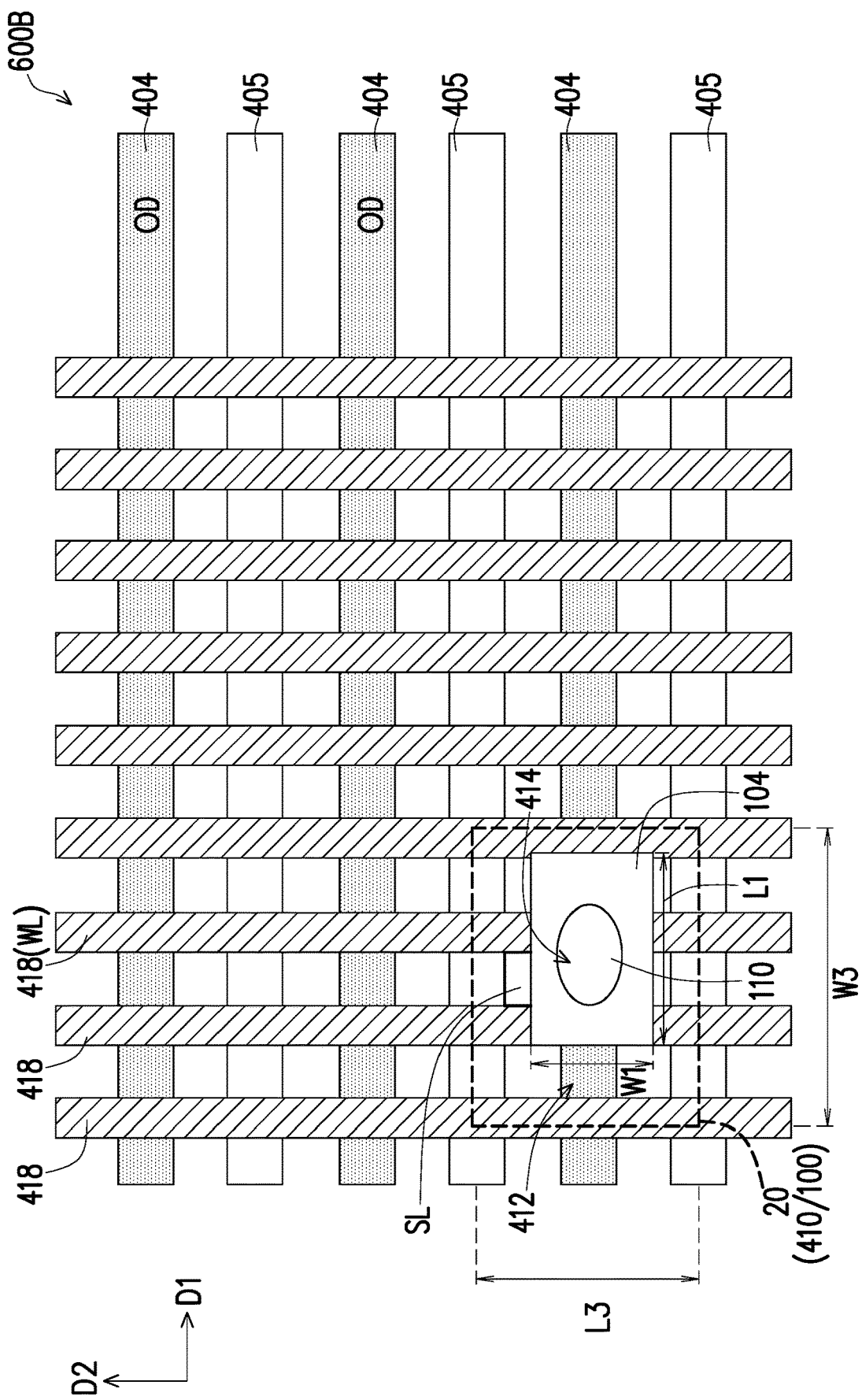
FIG. 4B is a top view of a memory device in accordance with another embodiment.

Referring to FIG. 4B, a memory device 600B may include a unit cell 20 including the transistor 410 and the memory cell 100, and the unit cell 20 is shown as a dashed box. The source line SL and the memory cell 100 (including the selector, the SOT layer 104, and the MTJ structure 110) are vertically stacked on the source region 414 of the transistor 410. The width W3 of the unit cell 20 may depend on the size of the transistor 410 and the length L1 of the SOT layer 104. Specifically, the length L1 of the SOT layer 104 may extend from one transistor 410 to overlay another transistor 410 (as shown in FIG. 4A). In this case, the width W3 of the unit cell 20 is approximately within the range of the three adjacent gate electrodes 418 (e.g., 3PO). On the other hand, the length L3 of the unit cell 20 may be reduced to less than the range of the two adjacent active areas 404 (e.g., 2OD) due to the width W1 less than the length L1 of the SOT layer 104. In other words, in the present embodiment, the length and the width of the unit cell is able to adjusted according to the design requirements, so as to increase the flexibility of the layout in the BEOL structure.

Figure 4C:
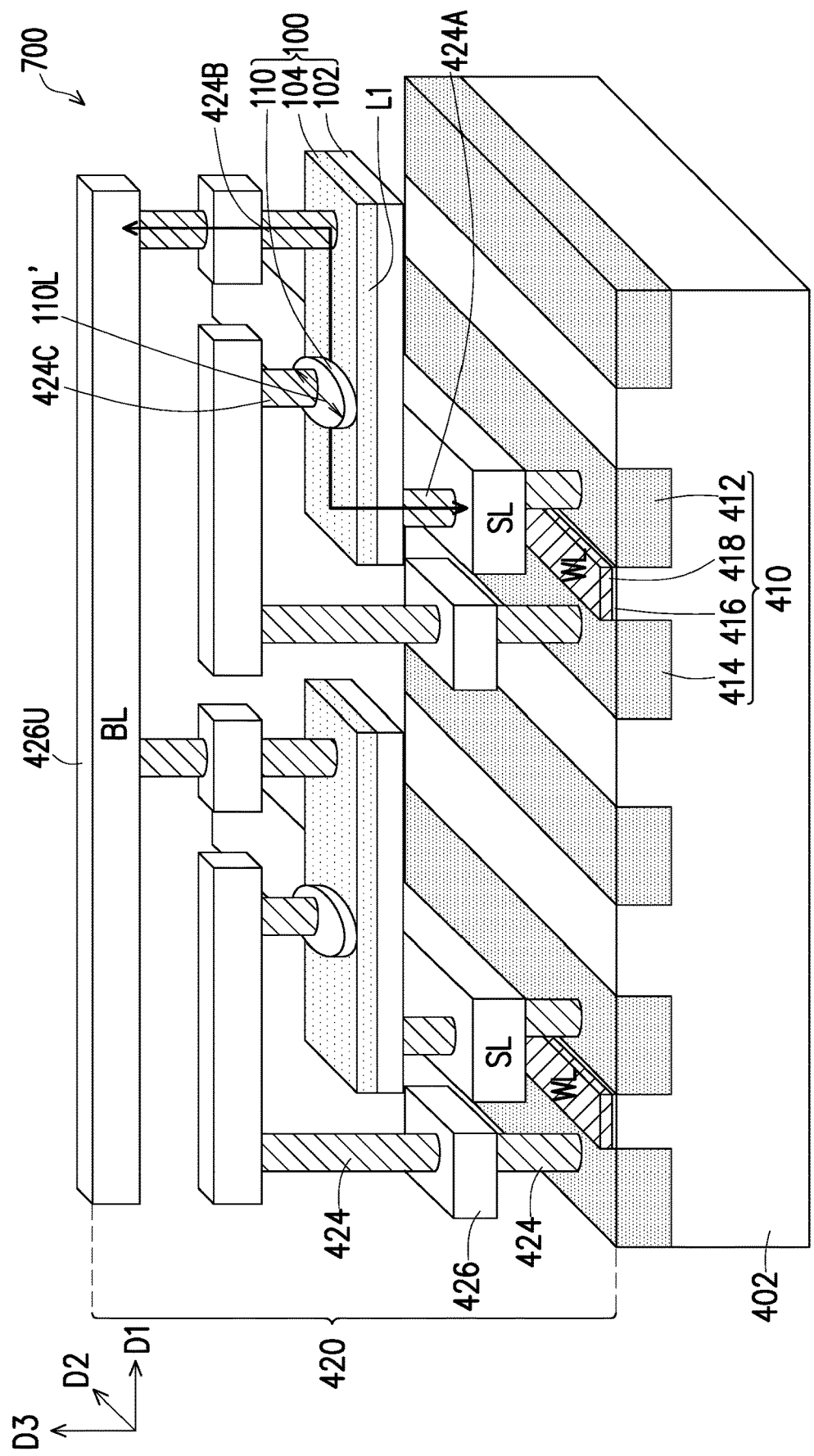
FIG. 4C is a perspective view of a memory device in accordance with a fourth embodiment.

FIG. 4C is a perspective view of a memory device in accordance with a fourth embodiment.

Referring to FIG. 4C, a memory device 700 of the fourth embodiment is similar to the memory device 600A of the third embodiment. That is, the structures, materials, and functions of the memory device 700 are similar to those of the memory device 600A, and thus the details are omitted herein. The main difference between the memory device 700 and the memory device 60 lies in that a long axis 110L' of the MTJ structure 110 of the memory device 700 is orthogonal to the length L1 of the SOT layer 104. In such embodiment, the long axis 110L' of the MTJ structure 110 of the memory device 700 may be orthogonal to the write path from the source line SL to the bit line BL.

Figure 5A:
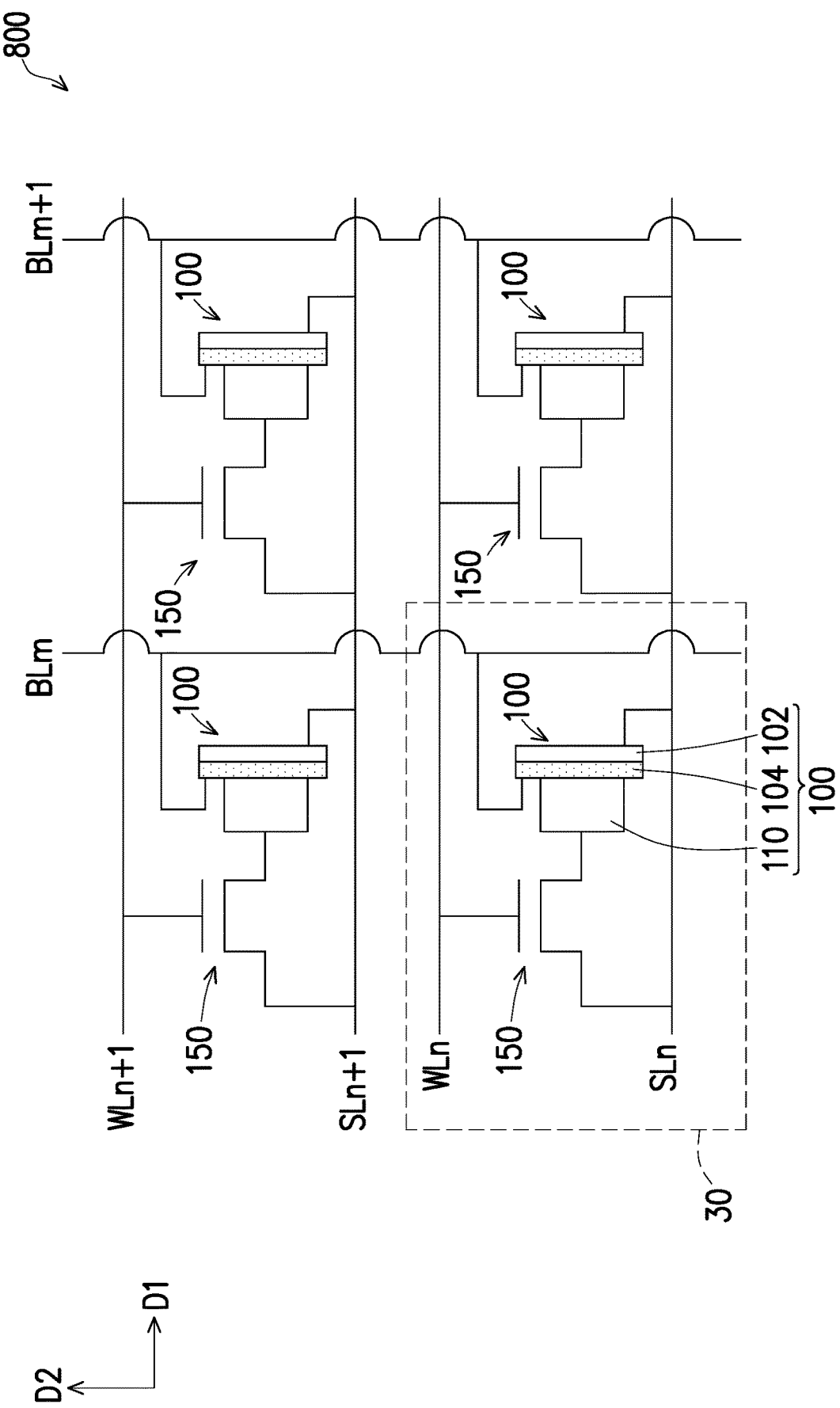
FIG. 5A is a circuit diagram of a memory array in accordance with some embodiments.

FIG. 5A is a circuit diagram of a memory array in accordance with some embodiments. FIG. 5B is an operation table of a memory array illustrated in FIG. 5A.

Referring to FIG. 5A, a memory array 800 includes a plurality of unit cells 30 arranged as an array having a plurality of columns and a plurality of rows. Herein, only one dashed box is illustrated in FIG. 5 to represent the chosen unit cell 30 for clarity. In some embodiments, the unit cells 30 each includes a memory cell 100 and a transistor 150 electrically coupled to each other. In addition, the memory array 800 further includes a plurality of bit lines BLm, BLm+1, a plurality of word lines WLn, WLn+1, and a plurality of source lines SLn, SLn+1, where the source lines SLn and SLn+1 are disposed between the word lines WLn and WLn+1. Specifically, the transistors 150 are arranged as an array having a plurality of columns and a plurality of rows. In some embodiments, the transistors 150 each include a source, a drain, and a gate. The gate of each transistor 150 is electrically coupled to a respective word line (e.g., WLn, or WLn+1), the drain of each transistor 150 is electrically coupled to a respective MTJ structure 110 of the memory cell 100, and the source of each transistor 150 is electrically coupled to a respective source line (e.g., SLn or SLn+1). Further, each bit line BLm or BLm+1 may be electrically coupled to a respective SOT layer 104 of the memory cell 100, and each source line SLn or SLn+1 may be electrically coupled to a respective selector 102 and the respective source of the transistor 150. In such embodiment, the unit cells 30 in a same horizontal row may share a common word line and a common source line, while the unit cells 30 in a same vertical column may share a common bit line. In the embodiment, the memory array 800 including the 1S1T1R configuration is able to operate by a cross-point operating method, so as to simplify the memory array programming, the detailed operation is shown as below.

In some embodiments, during write operation of the chosen unit cell 30 which is represented by as a dashed box in FIG. 5A, a write signal (e.g., a current and/or a voltage) is applied between the bit line BLm and the source line SLn, such that the write signal travels across the SOT layer 104. In detail, according to the operation table shown in FIG. 5B, when 1 unit of OTS threshold voltage (e.g., 1 Vth) is applied to the selected bit line BLm, 0.5 unit of threshold voltage (e.g., 0.5 Vth) is applied to other unselected bit lines such as BLm+1, 0 unit of threshold voltage (e.g., 0 Vth) is applied to the selected source line SLn, 0.5 unit of threshold voltage (e.g., 0.5 Vth) is applied to other unselected source lines such as SLn+1, and all word lines WLn and WLn+1 etc. are electrically floating, a data state (e.g., a logical "1") is stored in the MTJ structure 110 of the chosen unit cell 30. On the other hand, according to the operation table shown in FIG. 5B, when 0 unit of threshold voltage (e.g., 0 Vth) is applied to the selected bit line BLm, 0.5 unit of threshold voltage (e.g., 0.5 Vth) is applied to other unselected bit lines such as BLm+1, 1 unit of threshold voltage (e.g., 1 Vth) is applied to the selected source line SLn, 0.5 unit of threshold voltage (e.g., 0.5 Vth) is applied to other unselected source lines such as SLn+1, and all word lines WLn and WLn+1 are electrically floating, another data state (e.g., a logical "0") is stored in the MTJ structure 110 of the chosen unit cell 30.

Moreover, during read operation of the chosen unit cell 30, a read signal (e.g., a current and/or a voltage) is applied between the bit line BLm and the source line SLn, such that the read signal travels through the SOT layer 104 and the MTJ structure 110. That is, when reading the data stored in the MTJ structure 110, the word line WL is asserted to turn on the transistor 150. According to the conducting state of the MTJ structure 110, it can be determined whether the current provided by the bit line BLm can pass through the MTJ structure 110 and the transistor 150, and then flow to the source line SLn, thereby reading the data stored in the MTJ structure 110. For example, according to the operation table shown in FIG. 5B, less than 0.5 unit of threshold voltage (e.g., 0.1 Vth) is applied to the selected bit line BLm, other unselected bit lines such as BLm+1 is electrically floating, 0 unit of threshold voltage (e.g., 0 Vth) is applied to the selected source line SLn, other unselected source lines such as SLn+1 is electrically floating, the selected word line WLn is asserted to turn on the respective transistor 150, and other unselected word lines such as WLn+1 is electrically floating, the data state stored in the MTJ structure 110 of the chosen unit cell 30 is read.

Figure 6:
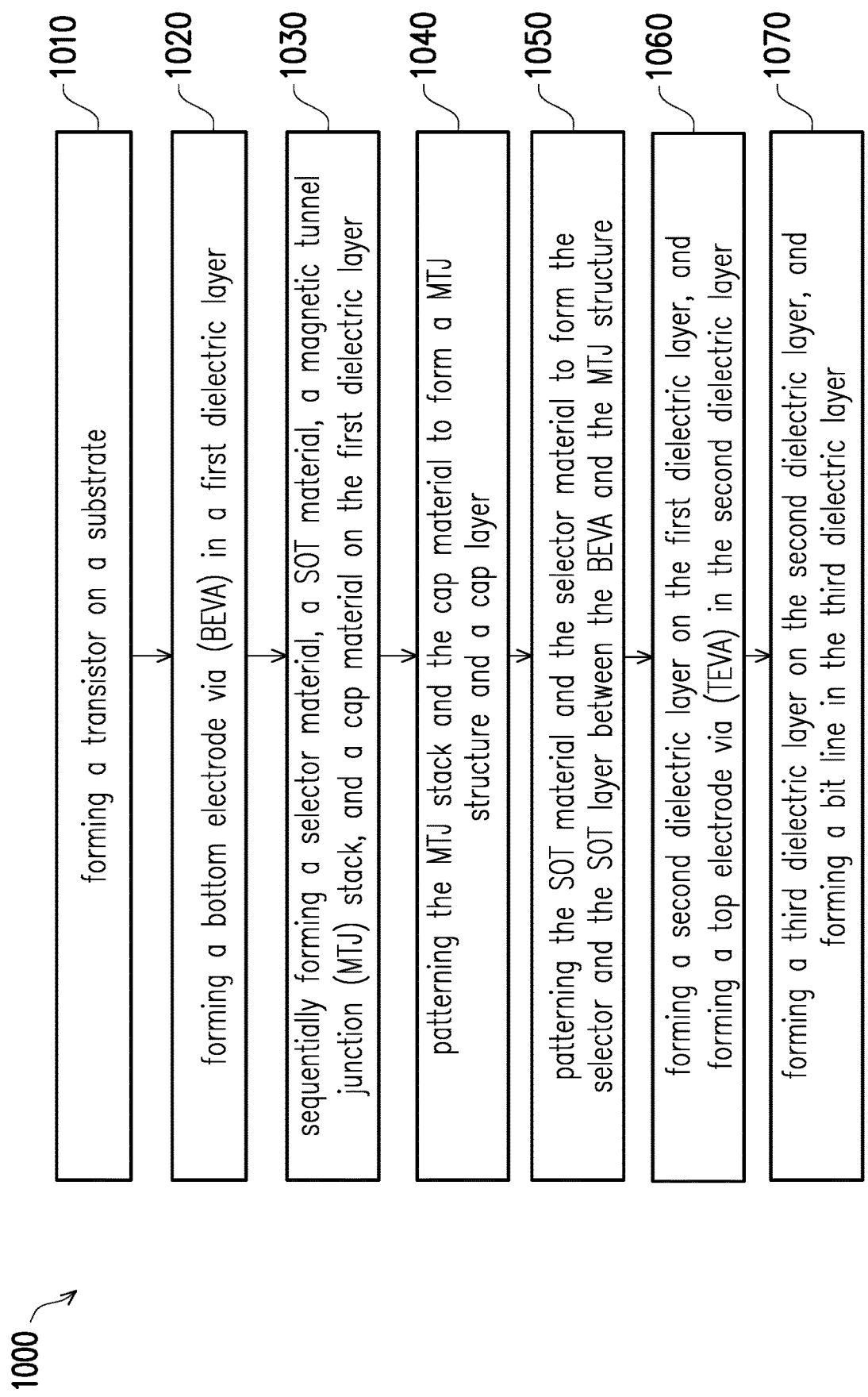
FIG. 6 illustrates a flow chart of a method of forming a memory device in accordance with some embodiments.

FIG. 6 illustrates a flow chart 1000 of a method of forming a memory device in accordance with some embodiments. While disclosed method 1000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. FIG. 6 may illustrate some embodiments of the method disclosed by FIG. 7 to FIG. 15.

Figure 7:
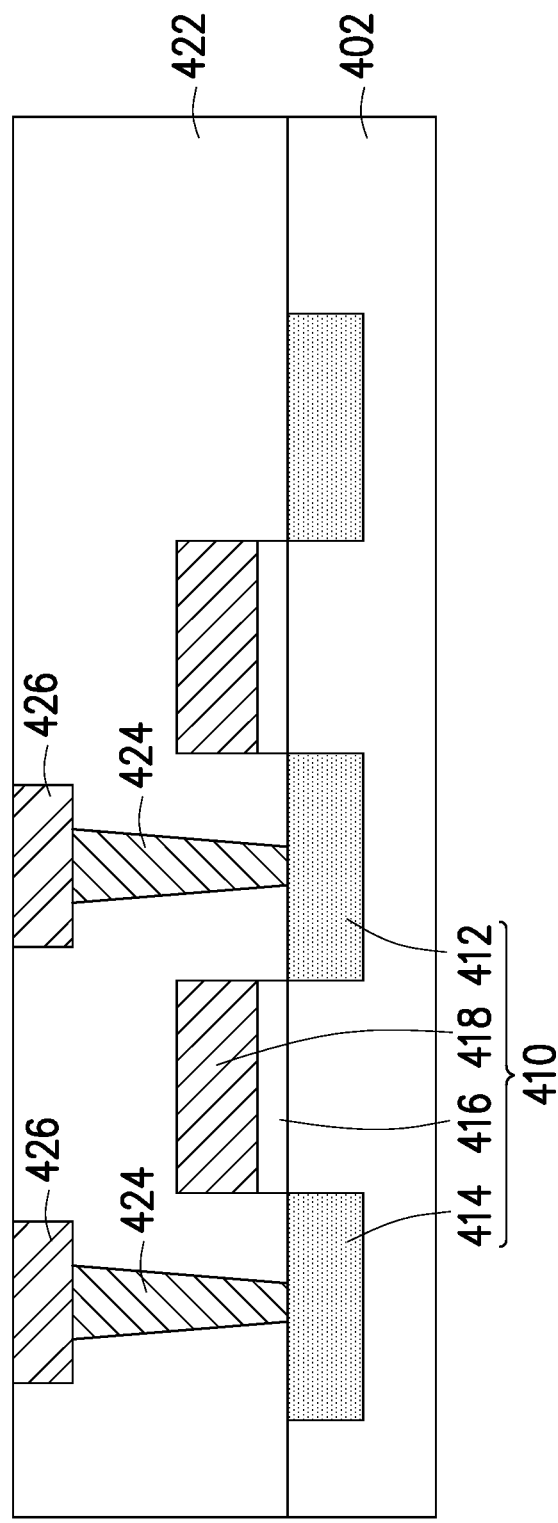
FIG. 7 to FIG. 15 are cross-sectional views of a method of forming a memory device in accordance with some embodiments.

Referring to FIG. 6, at block 1010, a transistor is formed on a substrate. FIG. 7 illustrates the cross-sectional view corresponding to some embodiments corresponding to block 1010. First, a substrate 402 is provided. In some embodiments, the substrate 402 is a semiconductor substrate, such as a bulk semiconductor, a semiconductor-on-insulator (SOI) substrate, or the like. The substrate 402 may be doped (e.g., with a p-type or an n-type dopant) or undoped. The substrate 402 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 402 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

As shown in FIG. 7, a plurality of transistors 410 are formed on the substrate 402. In detail, the transistors 410 each include a source region 412, a drain region 414, a gate dielectric layer 416, and a gate electrode 418. The gate dielectric layer 416 and the gate electrode 418 may be disposed on the semiconductor substrate 402, and gate dielectric layer 416 may be disposed between the gate electrode 418 and the semiconductor substrate 402. The source region 412 and the drain region 414 may be disposed in the semiconductor substrate 402 at opposite sides of the gate electrode 418. In some embodiments, the gate dielectric layer 416 may be a high-k dielectric material having a k value greater than about 7, and may include a metal oxide or a silicate of Hf, Al, Zr, La, Mg, Ba, Ti, Pb, or a combination thereof. The formation methods of the gate dielectric layer 416 may include Molecular-Beam Deposition (MBD), ALD, PECVD, or the like. In some embodiments, the gate electrode 418 may include polysilicon, a metal-containing material, such as TiN, TaN, TaC, Co, Ru, Al, combinations thereof, or multi-layers thereof. Although the gate electrode 418 shown in FIG. 7 is a single-layered structure, the embodiments of the present disclosure are not limited thereto. In other embodiments, any number of work function tuning layers may be formed between the gate dielectric layer 416 and the gate electrode 418. In addition, gate spacers (not shown) may be formed along sidewalls of the gate dielectric layer 416 and the gate electrode 418.

In some embodiments, the source/drain (S/D) regions 412 and 414 are formed in and/or on the substrate 402 at both sides of the gate electrode 418. In some embodiments, the S/D regions 412 and 414 may be doped regions formed in the substrate 402. The substrate 402 may include a first doping type (e.g., p-type) and the S/D regions 412 and 414 may include a second doping type (e.g., n-type) opposite the first doping type. In the FinFET example, the S/D regions 412 and 414 are formed over the semiconductor fins (e.g., OD space region shown in FIG. 3B) at both sides of the gate electrode 418. In some embodiments, the S/D regions 412 and 414 may be strained material includes any acceptable material, such as appropriate for p-type FinFETs or n-type FinFETs. For example, the strained material may include SiGe, SiGeB, Ge, GeSn, or the like for the p-type FinFETs. Alternatively, the strained material may include silicon, SiC, SiCP, SiP, or the like for the n-type FinFETs. Since the lattice constant of the strained material is different from the semiconductor fins, channel regions of the semiconductor fins are strained or stressed to enable carrier mobility of the device and enhance the device performance.

After forming the transistors 410, a dielectric layer 422 is formed over the substrate 402. Herein, the dielectric layer 422 may be referred to as an inter-level dielectric (ILD) layer. In some embodiments, the dielectric layer 422 may be deposited by chemical vapor deposition (CVD), physical vapor deposition (PVD), atomic layer deposition (ALD), or another suitable deposition process. In further embodiments, the dielectric layer 422 may, for example, be or comprise an oxide, such as silicon dioxide, a low-k dielectric material, or another suitable dielectric material. Conductive vias 424 and conductive wires 426 may be formed in the dielectric layer 422. In some embodiments, the conductive vias 424 and/or the conductive wires 426 may, for example, be formed by a single damascene process or a dual damascene process.

Figure 8:
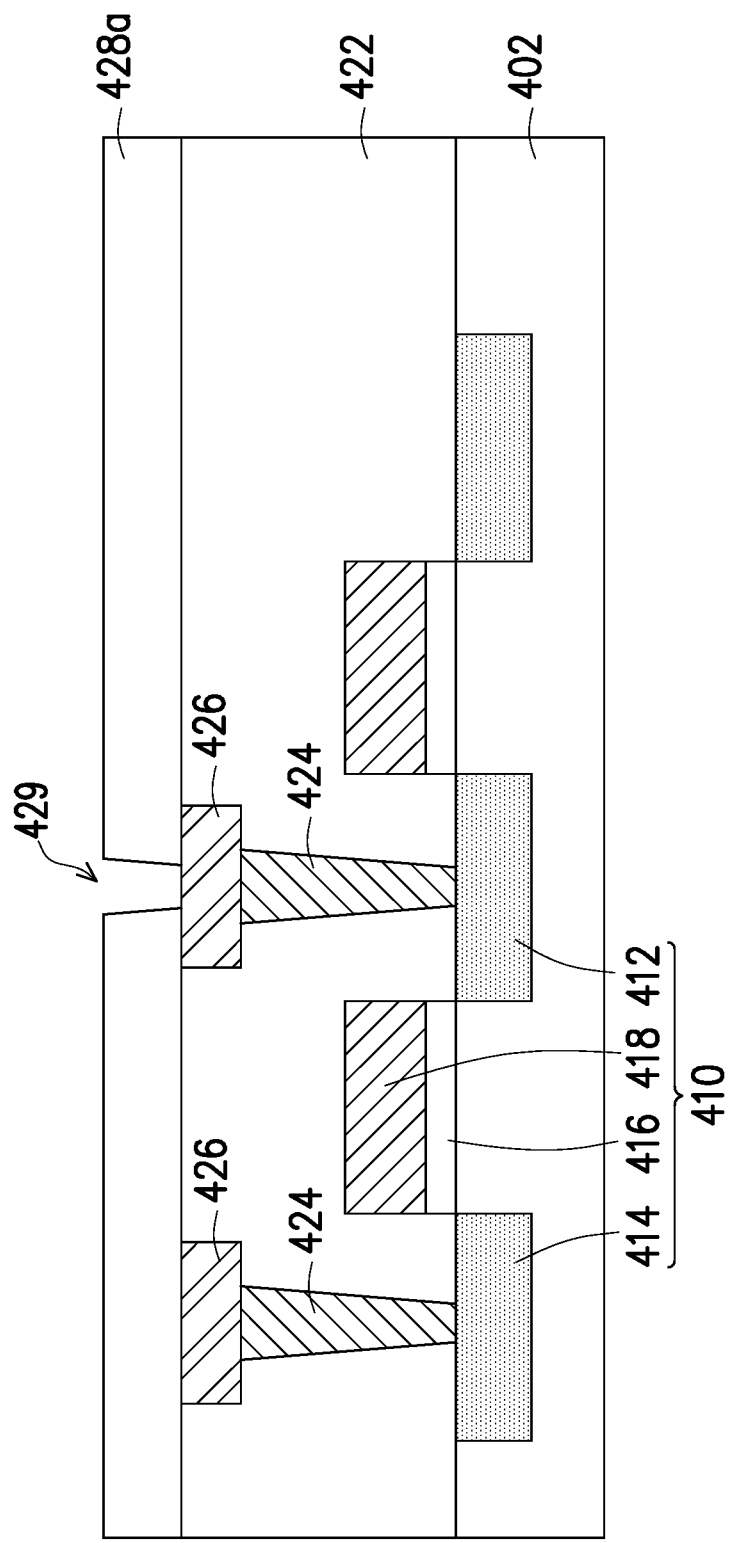
Figure 9:
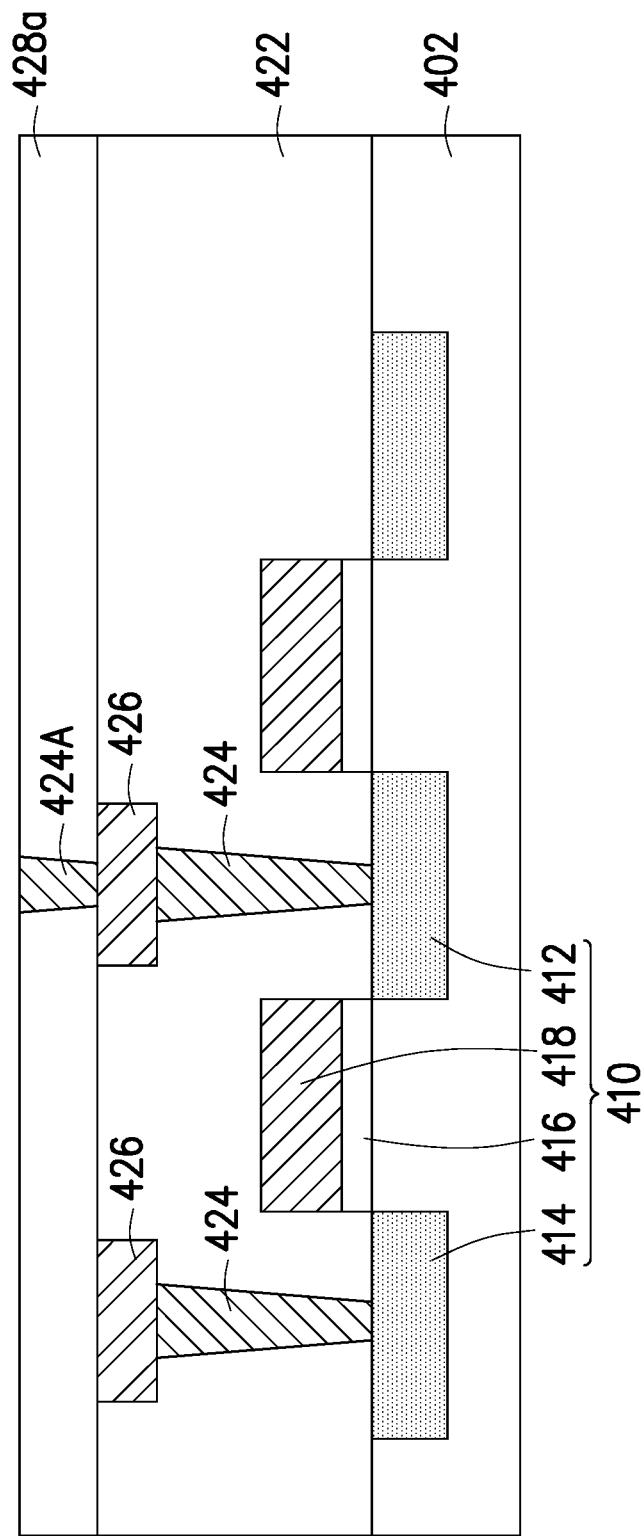

Referring to FIG. 6, at block 1020, a bottom electrode via (BEVA) is formed in a first dielectric layer. FIG. 8 and FIG. 9 illustrate the cross-sectional views corresponding to some embodiments corresponding to block 1020. As shown in FIG. 8, a first dielectric layer 428a is formed over the dielectric layer 422 and the conductive wires 426. Herein, the first dielectric layer 428a may be referred to as an inter-metal dielectric (IMD) layer. In some embodiments, the first dielectric layer 428a may, for example, be deposited by CVD, PVD, ALD, or another suitable deposition process. In some embodiments, the first dielectric layer 428a may, for example, be or comprise silicon dioxide, an extreme low-k dielectric material, silicon nitride, or the like. Further, after forming the first dielectric layer 428a, a patterning process may be performed on the first dielectric layer 428a to form at least one opening 429 in the first dielectric layer 428a. In some embodiments, the patterning process may expose an upper surface of the conductive wires 426. In further embodiments, the patterning process may include: forming a masking layer (not shown) over the first dielectric layer 428a; exposing unmasked regions of the first dielectric layer 428a to one or more etchants, thereby forming the opening 429; and performing a removal process to remove the masking layer.

As shown in FIG. 9, a BEVA 424A is then formed in the opening 429. In some embodiments, the BEVA 424A is formed to include following steps: forming a conductive material over the first dielectric layer 428a and filled in the opening 429; performing a planarization process (e.g., a chemical mechanical planarization (CMP) process) on the conductive material until a top surface of the first dielectric layer 428a is reached, thereby forming the BEVA 424A. In such embodiment, the BEVA 424A has a top surface level with or coplanar with the top surface of the first dielectric layer 428a. In some embodiments, the conductive material may, for example, be or comprise copper, aluminium, tungsten, a combination of the foregoing, or the like. Further, in some embodiments, the conductive material may, for example, be deposited by CVD, ALD, electroplating, PVD, another suitable deposition or growth process, or a combination of deposition or growth processes.

Figure 10:
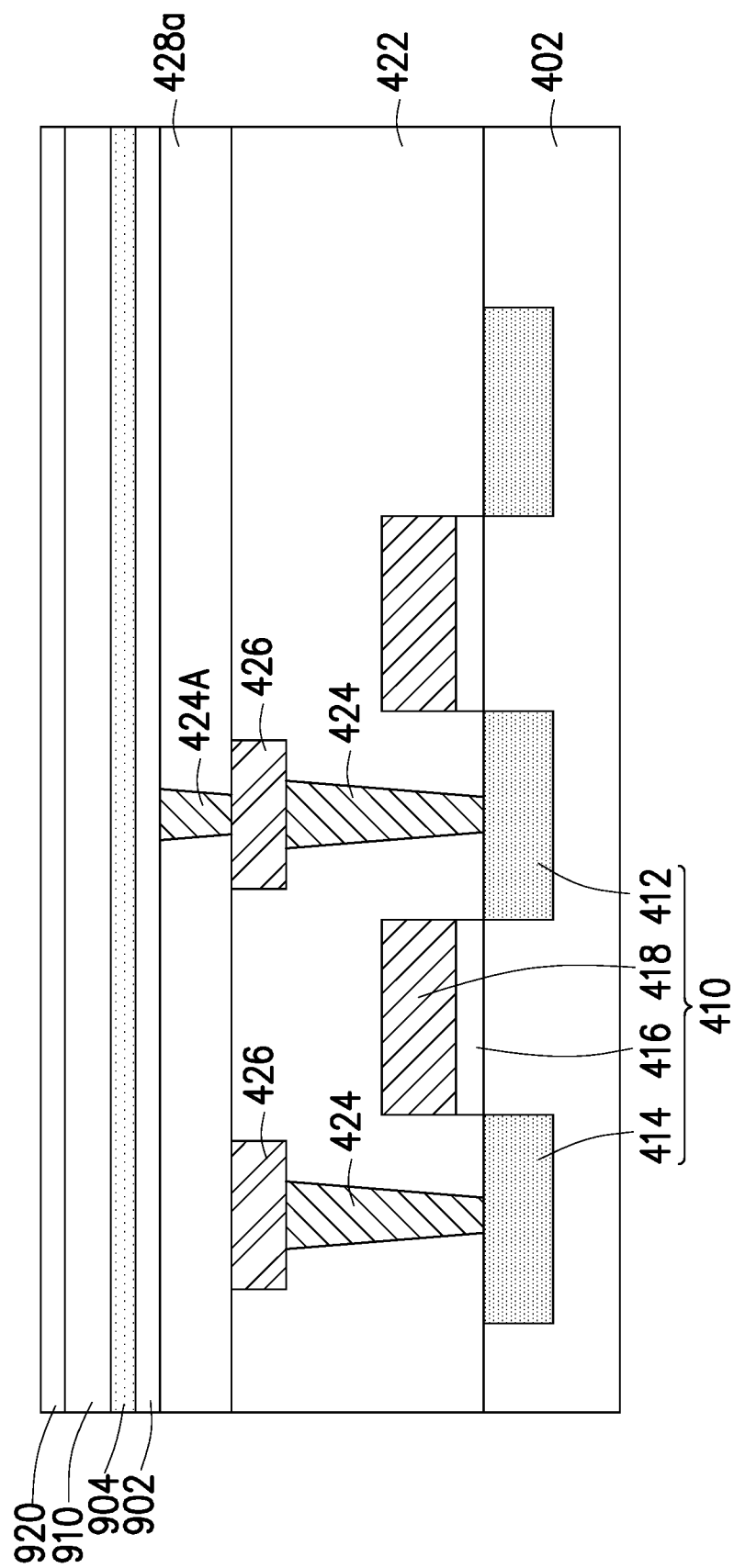

Referring to FIG. 6, at block 1030, a selector material, a spin orbit torque (SOT) material, a magnetic tunnel junction (MTJ) stack, and a cap material are sequentially formed on the first dielectric layer. FIG. 10 illustrates the cross-sectional view corresponding to some embodiments corresponding to block 1030. As shown in FIG. 10, a selector material 902, a SOT material 904, a MTJ stack 910, and a cap material 920 are sequentially formed on the first dielectric layer 428a. In some embodiments, the selector material 902 may include an ovonic threshold switch (OTS) material, an oxide based resistive material, or a combination thereof, or the like, and may be be deposited by CVD, PVD, ALD, or another suitable deposition process. The OTS material may include a chalcogenide material that is responsive to an applied voltage across the selector. In some embodiments, the SOT material 904 may be or include heavy metals such as platinum, palladium, tungsten, tantalum, gold, an alloy of the foregoing, such as an alloy of palladium and platinum (e.g., $Pd_{0.25}Pt_{0.75}$), an alloy of gold and platinum (e.g., $Au_{0.25}Pt_{0.75}$), or topological insulators such as $Bi_2Se_3$, $WTe_2$, or the like, and may be be deposited by CVD, PVD, ALD, or another suitable deposition process.

In some embodiments, the MTJ stack 910 at least includes a free material, a barrier material, a pinned reference material, and an anti-ferromagnetic (AFM) material stacked in order from bottom to top. The free material may be or comprise iron, cobalt, nickel, an alloy of the foregoing, cobalt iron boron, or the like, and may be be deposited by CVD, PVD, ALD, or another suitable deposition process. The barrier material may be or comprise magnesium oxide (MgO), aluminum oxide (e.g., $Al_2O_3$), nickel oxide, or the like, and may be be deposited by CVD, PVD, ALD, or another suitable deposition process. The pinned reference material may be or comprise iron, cobalt, nickel, an alloy of the foregoing, cobalt, iron boron, or the like, and may be be deposited by CVD, PVD, ALD, or another suitable deposition process. The AFM material may be or comprise platinum manganese (PtMn), iridium manganese (IrMn), rhodium manganese (RhMn) and iron manganese (FeMn), a combination thereof, or the like, and may be be deposited by CVD, PVD, ALD, or another suitable deposition process. In addition, the cap material 920 is formed to overlay the MTJ stack 910 by CVD, PVD, electroless plating, electroplating, or another suitable growth or deposition process. In some embodiments, the cap material 920 may include a single-layered structure, a bi-layered structure, or a multi-layered structure. The cap material 920 may be or comprise a conductive material, such as platinum, ruthenium, tantalum, tungsten, molybdenum or a combination thereof, or the like.

Figure 11:
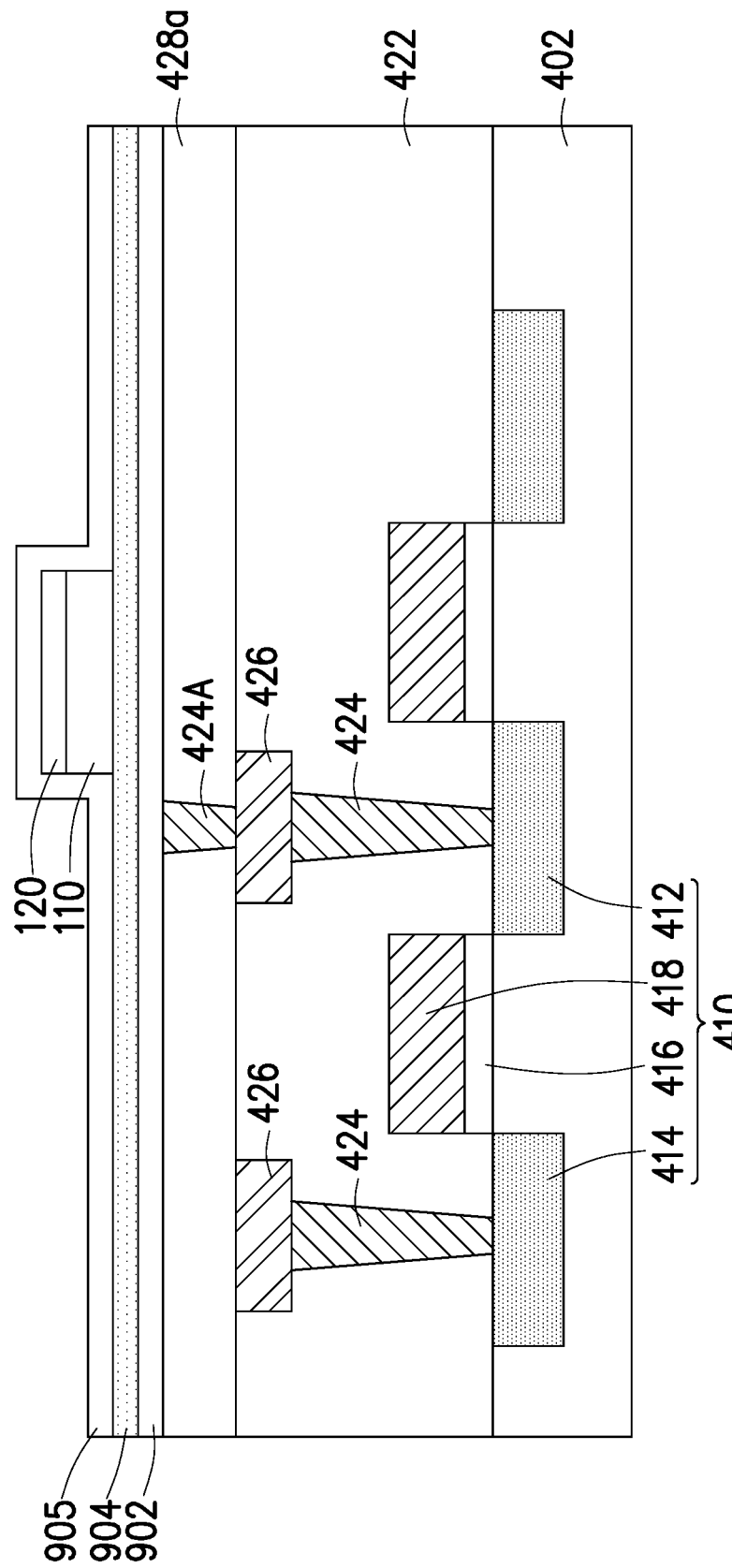

Referring to FIG. 6, at block 1040, the MTJ stack and the cap material are patterned to form a MTJ structure and a cap layer. FIG. 11 illustrates the cross-sectional view corresponding to some embodiments corresponding to block 1040. As shown in FIG. 11, the MTJ stack 910 and the capping material 920 are patterned to form a MTJ structure 110 and a cap layer 120. In some embodiments, a method for patterning the MTJ stack 910 and the capping material 920 may include: forming a masking layer (not shown) over the capping material 920; exposing unmasked regions of the MTJ stack 910 and the capping material 920 to one or more etchants, thereby removing the unmasked regions of the MTJ stack 910 and the capping material 920; and performing a removal process to remove the masking layer. In some embodiments, the SOT material 904 may act as an etch stop layer during the patterning process of the MTJ structure 110. In such embodiment, the cap layer 120 and the MTJ structure 110 are patterned or defined by the same masking layer, thus, the sidewalls of the formed cap layer 120 and MTJ structure 110 may be aligned to each other. After forming the MTJ structure 110 and the cap layer 120, an encapsulation material 905 may be formed to conformally cover the surfaces of the MTJ structure 110, the cap layer 120, and the SOT material 904, so as to prevent the MTJ structure 110 from being damaged or oxidized by the external environment and moisture.

Figure 12:
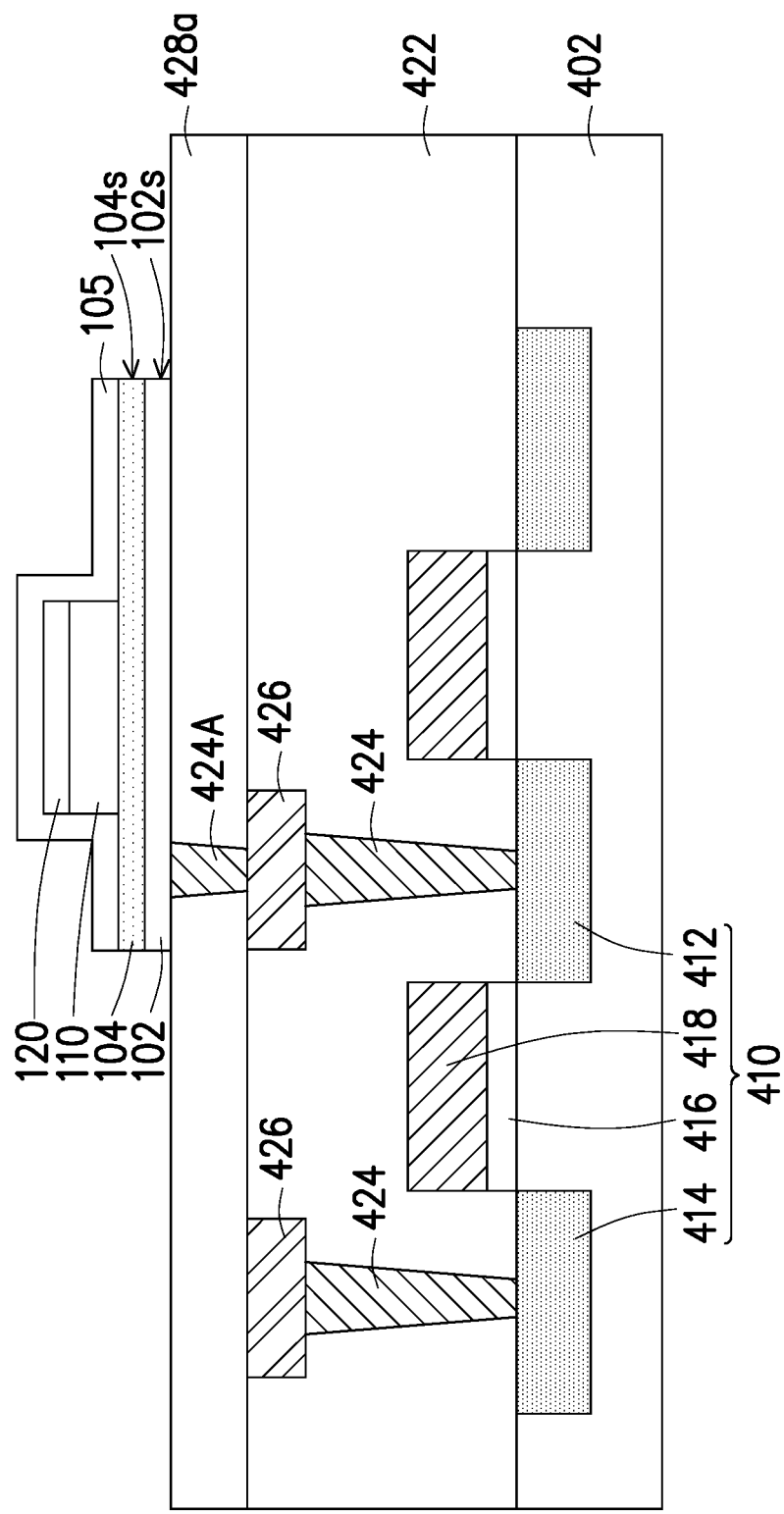

Referring to FIG. 6, at block 1050, the SOT material and the selector material are patterned to form the selector and the SOT layer between the BEVA and the MTJ structure. FIG. 12 illustrates the cross-sectional view corresponding to some embodiments corresponding to block 1050. As shown in FIG. 12, the SOT material 904 and the selector material 902 are patterned to form a selector 102 and a SOT layer 104 between the BEVA 424A and the MTJ structure 110. During patterning the SOT material 904 and the selector material 902, the encapsulation material 905 is also patterned to form an encapsulation layer 105 overlying the cap layer 120, the MTJ structure 110, and the SOT layer 104. In some embodiments, a method for patterning the SOT material 904 and the selector material 902 may include: forming a masking layer (not shown) over the encapsulation material 905 to overlay the cap layer 120, the MTJ structure 110, and a portion of the SOT material 904; exposing unmasked regions of the encapsulation material 905, the SOT material 904, and the selector material 902 to one or more etchants, thereby removing the unmasked regions of the encapsulation material 905, the SOT material 904, and the selector material 902; and performing a removal process to remove the masking layer. In such embodiment, the SOT material 904 and the selector material 902 are patterned or defined by the same masking layer, thus, the formed selector 102 has a sidewall 102s aligned with a sidewall 104s of the SOT layer 104. That is, the sidewall 102s of the selector 102 and the sidewall 104s of the SOT layer 104 extend on the same plane substantially perpendicular to the top surface of the first dielectric layer 428a. In some embodiments, the sidewall 102s of the selector 102 and the sidewall 104s of the SOT layer 104 may be vertically coincident, i.e., may be located within a vertical plane including the sidewall 102s of the selector 102 and the sidewall 104s of the SOT layer 104. From another aspect, the size of the selector 102 may be the same as the size of the SOT layer 104. Herein, the term "size" is referred to the length, width, or area. For example, as shown in FIG. 12, the width of the selector 102 is the same as the width of the SOT layer 104.

In some embodiments, the first dielectric layer 428a may act as an etch stop layer during the patterning process of the selector 102 and the SOT layer 104.

Figure 13:
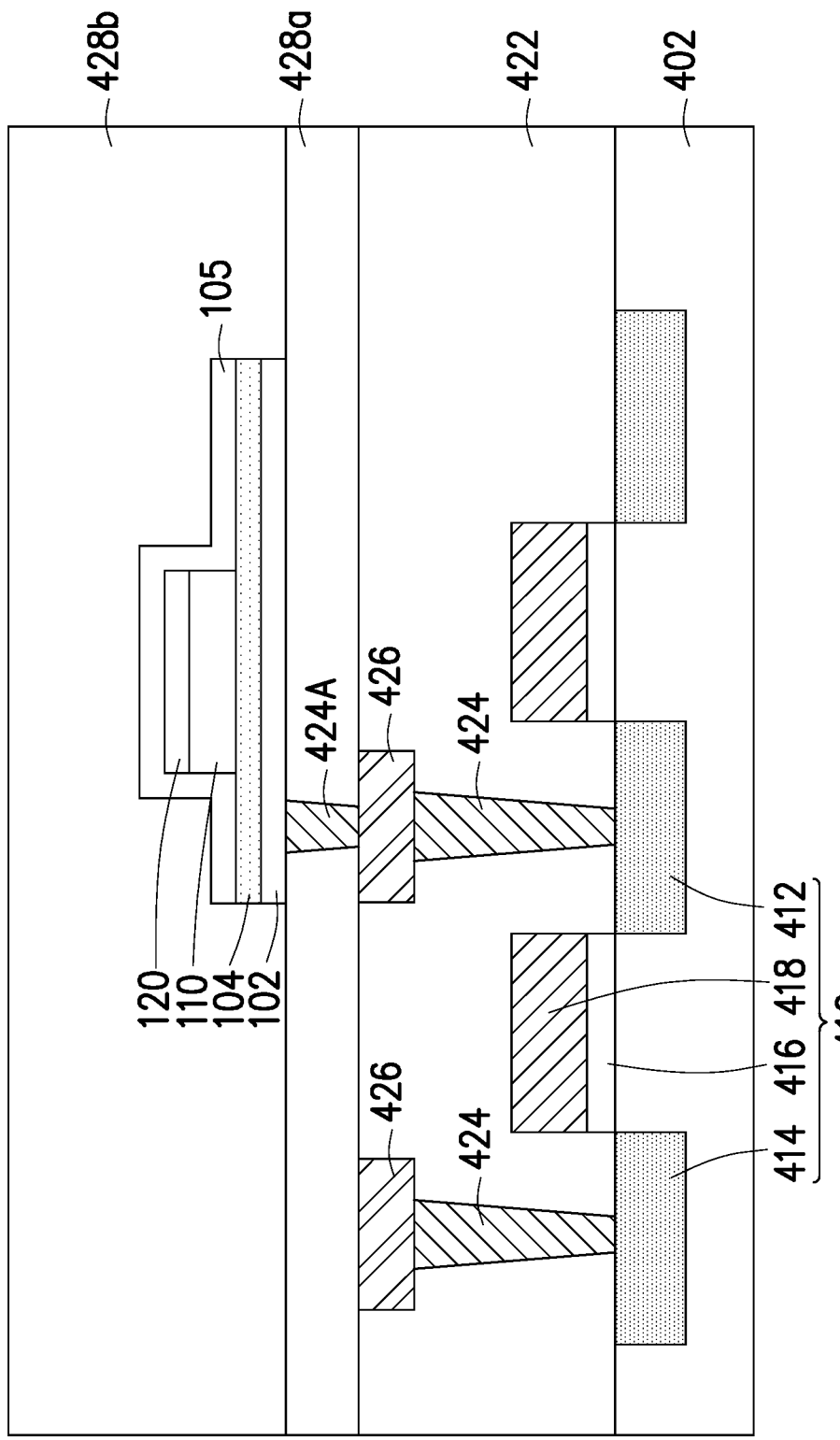
Figure 14:
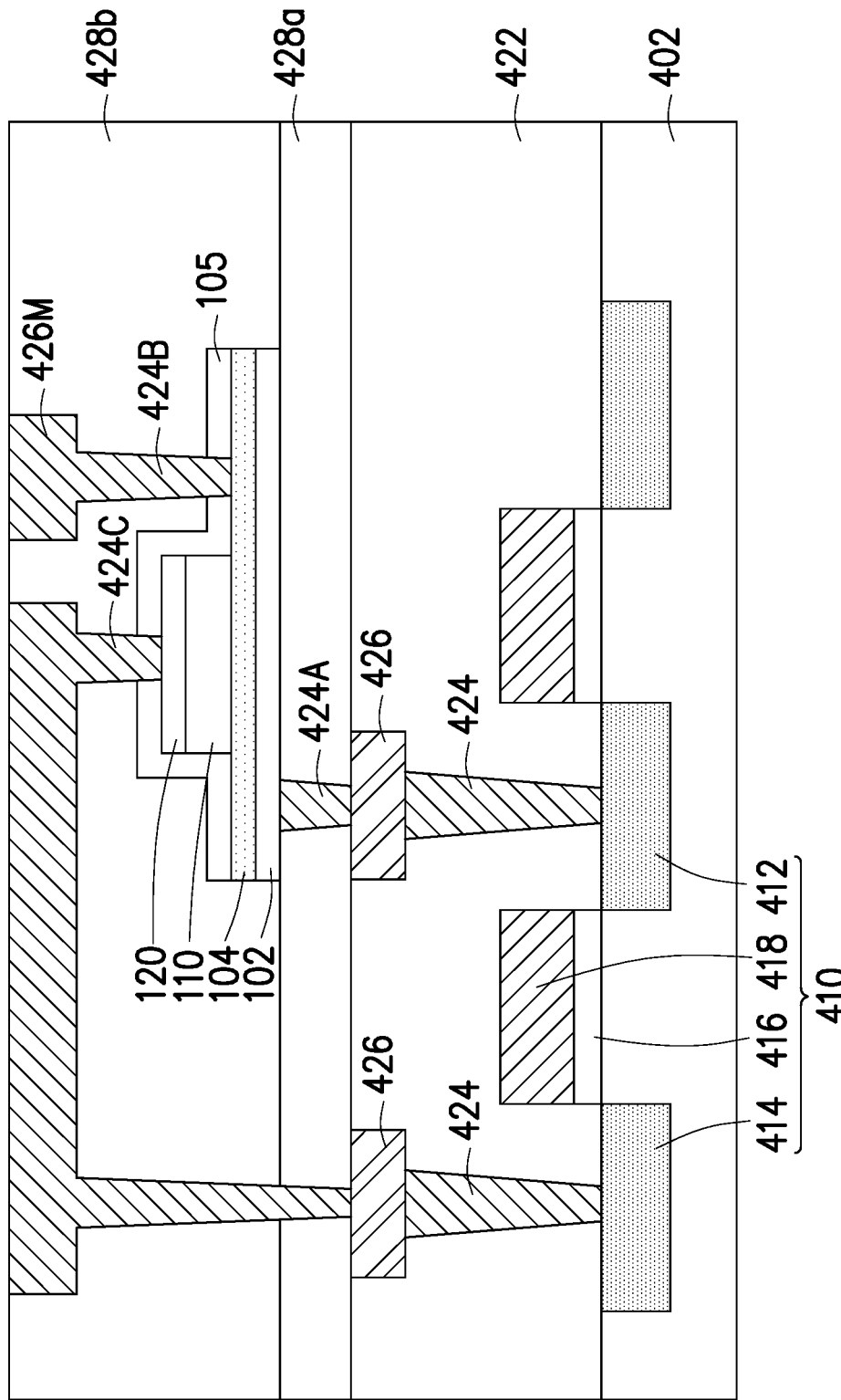

Referring to FIG. 6, at block 1060, a second dielectric layer is formed on the first dielectric layer, and a top electrode via (TEVA) is formed in the second dielectric layer. FIG. 13 and FIG. 14 illustrate the cross-sectional views corresponding to some embodiments corresponding to block 1060. As shown in FIG. 13, a second dielectric layer 428b is formed over the first dielectric layer 428a, where the second dielectric layer 428b covers the encapsulation layer 105, the selector 102, the SOT layer 104, the MTJ structure 110, and the cap layer 120. In other words, the encapsulation layer 105, the selector 102, the SOT layer 104, the MTJ structure 110, and the cap layer 120 may be embedded in the second dielectric layer 428b. Herein, the second dielectric layer 428b may be referred to as an inter-metal dielectric (IMD) layer. In some embodiments, the second dielectric layer 428b and the first dielectric layer 428a may have the same dielectric material or different dielectric materials.

Figure 15:
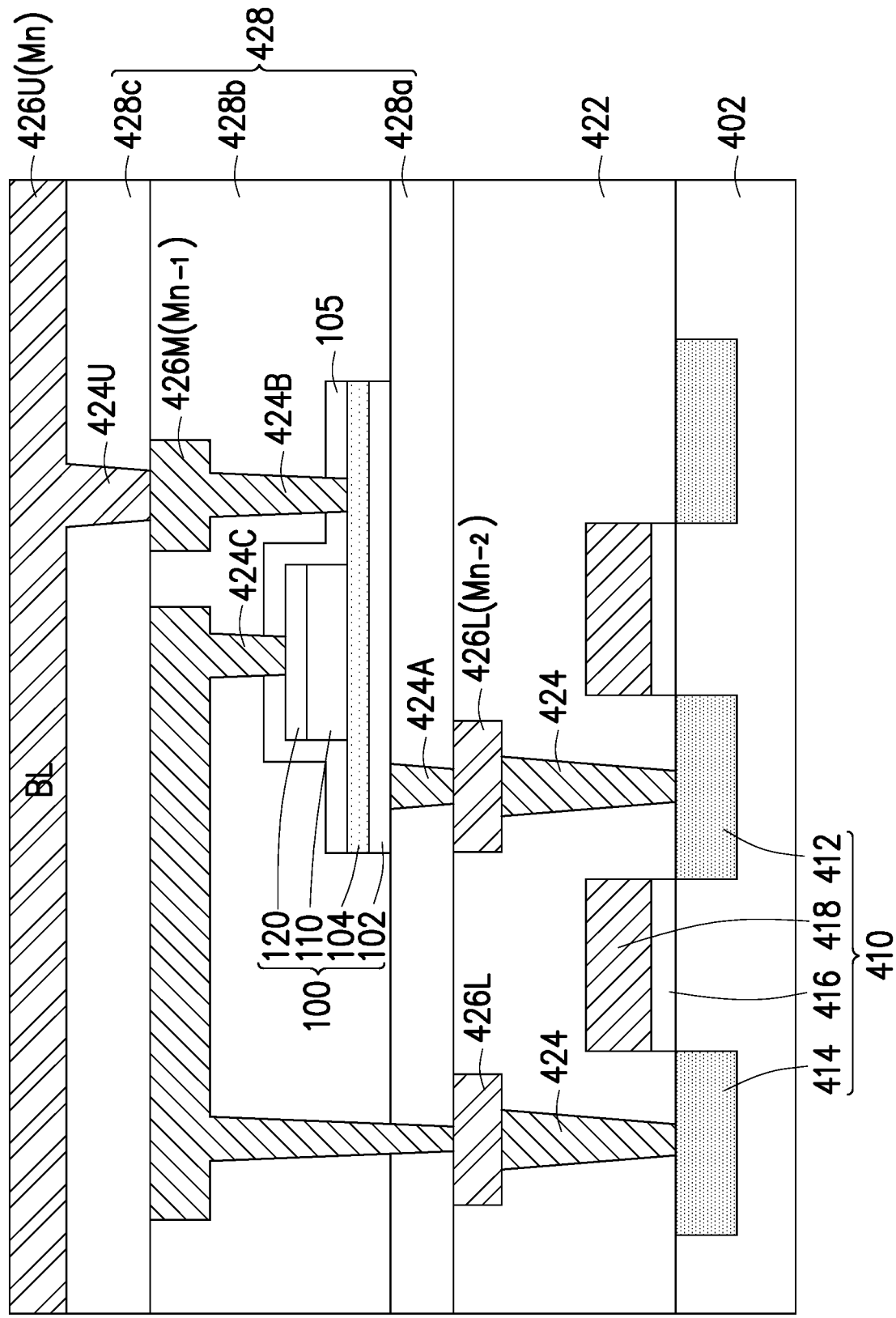

As shown in FIG. 14, a plurality of conductive vias 424 and a plurality of conductive wires 426 are formed in the second dielectric layer 428b to electrically couple the MTJ structure 110, the SOT layer 104, and the underlying conductive wire 426 formed in the dielectric layer 422. In some embodiments, the conductive vias 424 and the conductive wires 426 may be formed by performing a dual damascene process. Herein, the conductive via 424B formed on and may be in contact with the SOT layer 104 is electrically coupled to the to-be-formed bit line BL (as shown in FIG. 15). The conductive via 424C formed on and may be in contact with the cap layer 120 is referred to as the TEVA 424C. In some embodiments, the TEVA 424C overlying the MTJ structure 110 may penetrate through the encapsulation layer 105 to physically contact the cap layer 120, where the cap layer 120 may be referred to as a top electrode.

Referring to FIG. 6, at block 1070, a third dielectric layer is formed on the second dielectric layer, and a bit line is formed in the third dielectric layer. FIG. 15 illustrates the cross-sectional view corresponding to some embodiments corresponding to block 1070. As shown in FIG. 15, a third dielectric layer 428c is formed over the second dielectric layer 428b, where the third dielectric layer 428c covers the conductive wires 426 in the second dielectric layer 428b. Herein, the third dielectric layer 428c may be referred to as an inter-metal dielectric (IMD) layer, and the first, second, and third dielectric layers 428a, 428b, and 428c may be collectively referred to as a dielectric structure 428. In some embodiments, the third dielectric layer 428c and the first dielectric layer 428a may have the same dielectric material or different dielectric materials.

As shown in FIG. 15, an upper conductive via 424U and an upper conductive wire 426U are formed in the third dielectric layer 428c to electrically couple the SOT layer 104 through the conductive via 424B. In some embodiments, the upper conductive via 424U and the upper conductive wire 426U may be formed by performing a dual damascene process. Herein, the upper conductive wire 426U may be referred to as a bit line BL.

In some embodiments, the lower conductive wire 426L is referred to as the metal n-2 (Mn-2), the middle conductive wire 426M is referred to as the metal n-1 (Mn-1), and the upper conductive wire 426U is referred to as the metal n (Mn). The memory cell 100 may be disposed between the Mn-1 and the Mn-2. That is, the memory cell 100 may be disposed between any two adjacent conductive wires or layers in the back-end-of-line (BEOL) structure. For example, the memory cell 100 is disposed between the M2 and the M3, between the M3 and the M4, and so on. Alternatively, the memory cell 100 may be across one or more tiers of the conductive wires, so that the memory cell 100 may be disposed between the M2 and the M4, between the M3 and M5, and so on, thereby increasing the flexibility of the layout in the BEOL structure. In such embodiment, the fabricating process of the memory cell may be compatible with the BEOL process of the semiconductor device, thereby simplifying process steps and efficiently improving the integration density. In some alternative embodiments, the memory cell 100 is at the same level with the Mn-1. In addition, one or more conductive wires or layers may be further disposed between the Mn-2 and the transistors 410, between the lower conductive wire 426L and the BEVA 424A, or the Mn and the Mn-1.

Many variations of the above examples are contemplated by the present disclosure. It is understood that different embodiments may have different advantages, and that no particular advantage is necessarily required of all embodiments.

According to some embodiments, a memory device includes a selector, a magnetic tunnel junction (MTJ) structure, a spin orbit torque (SOT) layer, a transistor, a word line, a bit line, a first source line, and a second source line. The MTJ structure is disposed on the selector. The SOT layer is disposed between the selector and the MTJ structure. The SOT layer has a sidewall aligned with a sidewall of the selector. The transistor has a drain electrically coupled to the MTJ structure. The word line is electrically coupled to a gate of the transistor. The bit line is electrically coupled to the SOT layer. The first source line is electrically coupled to a source of the transistor. The second source line is electrically coupled to the selector. The transistor is configured to control a write signal flowing between the bit line and the second source line, and control a read signal flowing between the bit line and the first source line. In some embodiment, the memory device further includes a first electrical terminal, electrically coupled to the selector and the second source line; a second electrical terminal, electrically coupled to the SOT layer and the bit line, wherein a contact area between the first electrical terminal and the selector is less than a contact area between the second electrical terminal and the SOT layer; and a third electrical terminal, disposed on the MTJ structure and electrically coupled to the MTJ structure and the transistor. In some embodiment, the write signal vertically passes through the selector and laterally travels across the SOT layer, while the read signal vertically passes through the MTJ structure and laterally travels across the SOT layer. In some embodiment, the first source line and the second source line are electrically connected to each other to form a common source line. In some embodiment, the bit line extends along a first direction, and the word line extends along a second direction different from the first direction. In some embodiment, the SOT layer comprises a width along the first direction and a length along the second direction, the length is greater than the width, and the length is parallel to a long axis of the MTJ structure. In some embodiment, the SOT layer comprises a width along the first direction and a length along the second direction, the length is greater than the width, and the length is orthogonal to a long axis of the MTJ structure. In some embodiment, the SOT layer comprises a length along the first direction and a width along the second direction, the length is greater than the width, and the length is parallel to a long axis of the MTJ structure. In some embodiment, the SOT layer comprises a length along the first direction and a width along the second direction, the length is greater than the width, and the length is orthogonal to a long axis of the MTJ structure. In some embodiment, the MTJ structure at least comprises: a free layer contacting the SOT layer; a pinned reference layer disposed on the free layer; and a barrier layer disposed between the free layer and the pinned reference layer.

According to some embodiments, a method of forming a memory device includes: forming a transistor on a substrate; forming an interconnect structure on the transistor; and forming a memory cell in the interconnect structure, wherein the memory cell comprises: a selector, electrically coupled to a source of the transistor; a magnetic tunnel junction (MTJ) structure, formed on the selector and electrically coupled to a drain of the transistor; and a spin orbit torque (SOT) layer, formed between the selector and the MTJ structure. The SOT layer has a sidewall aligned with a sidewall of the selector. The transistor is configured to control a write signal traveling across the SOT layer and the selector, and control a read signal traveling across the SOT layer and the MTJ structure. In some embodiment, the forming of the memory cell comprises: forming a bottom electrode via (BEVA) in a first dielectric layer; forming a selector material on the first dielectric layer; forming a SOT material on the selector material; forming a MTJ stack and a cap material on the SOT material; patterning the MTJ stack and the cap material to form the MTJ structure and a cap layer; patterning the SOT material and the selector material by the same masking layer to form the selector and the SOT layer between the BEVA and the MTJ structure; forming a second dielectric layer on the first dielectric layer, wherein the second dielectric layer covers the MTJ structure, the cap layer, the SOT layer, and the selector; forming a top electrode via (TEVA) in the second dielectric layer, wherein the TEVA is landed on the cap layer to be electrical coupled to the MTJ structure; forming a third dielectric layer on the second dielectric layer; and forming a bit line in the third dielectric layer, wherein the bit line is electrical coupled to the SOT layer. In some embodiment, the MTJ structure at least comprises: a free layer contacting the SOT layer; a pinned reference layer formed on the free layer; and a barrier layer formed between the free layer and the pinned reference layer. In some embodiment, the bit line extends along a first direction, and a gate of the transistor extend along a second direction different from the first direction. In some embodiment, the SOT layer comprises a width along a first direction and a length along a second direction, the length is greater than the width, and the length is parallel to a long axis of the MTJ structure. In some embodiment, the SOT layer comprises a width along a first direction and a length along a second direction, the length is greater than the width, and the length is orthogonal to a long axis of the MTJ structure.

According to some embodiments, a memory array includes: a plurality of memory cells, wherein each memory cell comprises: a selector, a magnetic tunnel junction (MTJ) structure, and a spin orbit torque (SOT) layer disposed between the selector and the MTJ structure; a plurality of transistors arranged as an array having a plurality of columns and a plurality of rows, wherein the plurality of transistors have a plurality of drains respectively electrically coupled to a plurality of MTJ structures of the plurality of memory cells; a plurality of bit lines respectively electrically coupled to a plurality of SOT layers of the plurality of memory cells; a plurality of word lines respectively electrically coupled to a plurality of gates of the plurality of transistors; and a plurality of source lines respectively electrically coupled to a plurality of sources of the plurality of transistors and a plurality of selectors of the plurality of memory cells. One of the plurality of transistors is configured to control a write signal and a read signal of a corresponding memory cell. In some embodiment, the plurality of bit lines extend along a first direction, and the plurality of word lines extend along a second direction different from the first direction. In some embodiment, the plurality of source lines respectively disposed between the plurality of word lines, and extend along the second direction. In some embodiment, each MTJ structure at least comprises: a free layer contacting a corresponding SOT layer; a pinned reference layer disposed on the free layer; and a barrier layer disposed between the free layer and the pinned reference layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a selector;
a magnetic tunnel junction (MTJ) structure, disposed on the selector;
a spin orbit torque (SOT) layer, disposed between the selector and the MTJ structure, wherein the SOT layer has a sidewall aligned with a sidewall of the selector;
a transistor, wherein the transistor has a drain electrically coupled to the MTJ structure;
a word line, electrically coupled to a gate of the transistor;
a bit line, electrically coupled to the SOT layer;
a first source line, electrically coupled to a source of the transistor; and
a second source line, electrically coupled to the selector, wherein the transistor is configured to control a write signal flowing between the bit line and the second source line, and control a read signal flowing between the bit line and the first source line.

2. The memory device of claim 1, further comprising:
a first electrical terminal, electrically coupled to the selector and the second source line;
a second electrical terminal, electrically coupled to the SOT layer and the bit line, wherein a contact area between the first electrical terminal and the selector is less than a contact area between the second electrical terminal and the SOT layer; and
a third electrical terminal, disposed on the MTJ structure and electrically coupled to the MTJ structure and the transistor.

3. The memory device of claim 1, wherein the write signal vertically passes through the selector and laterally travels across the SOT layer, while the read signal vertically passes through the MTJ structure and laterally travels across the SOT layer.

4. The memory device of claim 1, wherein the first source line and the second source line are electrically connected to each other to form a common source line.

5. The memory device of claim 1, wherein the bit line extends along a first direction, and the word line extends along a second direction different from the first direction.

6. The memory device of claim 5, wherein the SOT layer comprises a width along the first direction and a length along the second direction, the length is greater than the width, and the length is parallel to a long axis of the MTJ structure.

7. The memory device of claim 5, wherein the SOT layer comprises a width along the first direction and a length along the second direction, the length is greater than the width, and the length is orthogonal to a long axis of the MTJ structure.

8. The memory device of claim 5, wherein the SOT layer comprises a length along the first direction and a width along the second direction, the length is greater than the width, and the length is parallel to a long axis of the MTJ structure.

9. The memory device of claim 5, wherein the SOT layer comprises a length along the first direction and a width along the second direction, the length is greater than the width, and the length is orthogonal to a long axis of the MTJ structure.

10. The memory device of claim 1, wherein the MTJ structure at least comprises:
a free layer contacting the SOT layer;
a pinned reference layer disposed on the free layer; and
a barrier layer disposed between the free layer and the pinned reference layer.

11. A method of forming a memory device, comprising:
forming a transistor on a substrate;
forming an interconnect structure on the transistor; and
forming a memory cell in the interconnect structure, wherein the memory cell comprises:
a selector, electrically coupled to a source of the transistor;
a magnetic tunnel junction (MTJ) structure, formed on the selector and electrically coupled to a drain of the transistor; and
a spin orbit torque (SOT) layer, formed between the selector and the MTJ structure, wherein the SOT layer has a sidewall aligned with a sidewall of the selector, wherein the transistor is configured to control a write signal traveling across the SOT layer and the selector, and control a read signal traveling across the SOT layer and the MTJ structure.

12. The method of claim 11, wherein the forming the memory cell comprises:
forming a bottom electrode via (BEVA) in a first dielectric layer;
forming a selector material on the first dielectric layer;
forming a SOT material on the selector material;
forming a MTJ stack and a cap material on the SOT material;
patterning the MTJ stack and the cap material to form the MTJ structure and a cap layer;
patterning the SOT material and the selector material by the same masking layer to form the selector and the SOT layer between the BEVA and the MTJ structure;
forming a second dielectric layer on the first dielectric layer, wherein the second dielectric layer covers the MTJ structure, the cap layer, the SOT layer, and the selector;
forming a top electrode via (TEVA) in the second dielectric layer, wherein the TEVA is landed on the cap layer to be electrical coupled to the MTJ structure;
forming a third dielectric layer on the second dielectric layer; and
forming a bit line in the third dielectric layer, wherein the bit line is electrical coupled to the SOT layer.

13. The method of claim 12, wherein the MTJ structure at least comprises:
a free layer contacting the SOT layer;
a pinned reference layer formed on the free layer; and
a barrier layer formed between the free layer and the pinned reference layer.

14. The method of claim 12, wherein the bit line extends along a first direction, and a gate of the transistor extend along a second direction different from the first direction.

15. The method of claim 11, wherein the SOT layer comprises a width along a first direction and a length along a second direction, the length is greater than the width, and the length is parallel to a long axis of the MTJ structure.

16. The method of claim 12, wherein the SOT layer comprises a width along a first direction and a length along a second direction, the length is greater than the width, and the length is orthogonal to a long axis of the MTJ structure.

17. A memory array, comprising:
- a plurality of memory cells, wherein each memory cell comprises: a selector, a magnetic tunnel junction (MTJ) structure, and a spin orbit torque (SOT) layer disposed between the selector and the MTJ structure;
- a plurality of transistors arranged as an array having a plurality of columns and a plurality of rows, wherein the plurality of transistors have a plurality of drains respectively electrically coupled to a plurality of MTJ structures of the plurality of memory cells;
- a plurality of bit lines respectively electrically coupled to a plurality of SOT layers of the plurality of memory cells;
- a plurality of word lines respectively electrically coupled to a plurality of gates of the plurality of transistors; and
- a plurality of source lines respectively electrically coupled to a plurality of sources of the plurality of transistors and a plurality of selectors of the plurality of memory cells, wherein one of the plurality of transistors is configured to control a write signal and a read signal of a corresponding memory cell.

18. The memory array of claim 17, wherein the plurality of bit lines extend along a first direction, and the plurality of word lines extend along a second direction different from the first direction.

19. The memory array of claim 18, wherein the plurality of source lines respectively disposed between the plurality of word lines, and extend along the second direction.

20. The memory array of claim 17, wherein each MTJ structure at least comprises:
- a free layer contacting a corresponding SOT layer;
- a pinned reference layer disposed on the free layer; and
- a barrier layer disposed between the free layer and the pinned reference layer.

\* \* \* \* \*